(12) United States Patent
Fujita et al.

(10) Patent No.: US 12,414,397 B2
(45) Date of Patent: Sep. 9, 2025

(54) IMAGE SENSOR WITH PIXEL SEPARATION STRUCTURE

(71) Applicant: SAMSUNG ELECTRONICS CO., LTD., Suwon-si (KR)

(72) Inventors: Masato Fujita, Suwon-si (KR); Kyungho Lee, Suwon-si (KR); Doosik Seol, Suwon-si (KR); Taesub Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 696 days.

(21) Appl. No.: 17/675,145

(22) Filed: Feb. 18, 2022

(65) Prior Publication Data

US 2022/0359585 A1 Nov. 10, 2022

(30) Foreign Application Priority Data

May 4, 2021 (KR) .......................... 10-2021-0057640

(51) Int. Cl.
*H10F 39/00* (2025.01)
(52) U.S. Cl.
CPC ......... *H10F 39/807* (2025.01); *H10F 39/802* (2025.01); *H10F 39/8037* (2025.01);
(Continued)
(58) Field of Classification Search
CPC .......... H01L 27/1463; H01L 27/14603; H01L 27/14612; H01L 27/14621;
(Continued)

(56) References Cited

U.S. PATENT DOCUMENTS

| 9,935,142 B2 | 4/2018 | Hwangbo et al. |
| 10,998,365 B2 | 5/2021 | Pyo et al. |

(Continued)

FOREIGN PATENT DOCUMENTS

| JP | 2018-201015 | 12/2018 |
| KR | 10-2017-0086175 | 7/2017 |

(Continued)

OTHER PUBLICATIONS

Office Action dated Apr. 23, 2025 issued in corresponding Korean Patent Application No. 10-2021-0057640.

*Primary Examiner* — Thanh Luu
*Assistant Examiner* — Mai Thi Ngoc Tran
(74) *Attorney, Agent, or Firm* — Morgan, Lewis & Bockius LLP

(57) ABSTRACT

Provided is an image sensor including a semiconductor substrate having first and second surfaces disposed opposite to the first surface, a pixel separation structure disposed in the semiconductor substrate and defining and surrounding a pixel region, first and second photoelectric conversion regions disposed in the semiconductor substrate on the pixel region, a first transfer gate electrode disposed on the first surface of the semiconductor substrate and between the first photoelectric conversion region and a first floating diffusion region, a second transfer gate electrode disposed on the first surface of the semiconductor substrate and between the second photoelectric conversion region and a second floating diffusion region, a pixel gate electrode disposed on the first surface of the semiconductor substrate and overlapping one of the first and second photoelectric conversion regions, and impurity regions disposed on opposite sides of the pixel gate electrode.

14 Claims, 32 Drawing Sheets

(52) U.S. Cl.
CPC ..... *H10F 39/8053* (2025.01); *H10F 39/8063* (2025.01); *H10F 39/811* (2025.01)

(58) Field of Classification Search
CPC ......... H01L 27/14627; H01L 27/14636; H01L 27/14645; H01L 27/14616; H01L 27/1461; H01L 27/14634
See application file for complete search history.

(56) References Cited

U.S. PATENT DOCUMENTS

| | | | |
|---|---|---|---|
| 11,063,081 B2 | 7/2021 | Sze et al. | |
| 11,075,236 B2 | 7/2021 | Shiraishi et al. | |
| 11,348,960 B2 | 5/2022 | Ha et al. | |
| 2014/0151690 A1* | 6/2014 | Kim | H01L 29/78693 257/43 |
| 2015/0294979 A1* | 10/2015 | Choi | H01L 23/5252 257/379 |
| 2018/0190690 A1* | 7/2018 | Lee | H01L 27/1462 |
| 2018/0190707 A1* | 7/2018 | Lee | H01L 27/14621 |
| 2018/0197904 A1* | 7/2018 | Oh | H01L 27/1463 |
| 2019/0371848 A1 | 12/2019 | Ikeda et al. | |
| 2020/0168644 A1 | 5/2020 | Yun et al. | |
| 2020/0176492 A1 | 6/2020 | Huang | |
| 2020/0304742 A1 | 9/2020 | Yun et al. | |

FOREIGN PATENT DOCUMENTS

| | | |
|---|---|---|
| KR | 10-2018-0000933 | 1/2018 |
| KR | 10-2018-0077969 | 7/2018 |
| KR | 10-2018-0078516 A | 7/2018 |
| KR | 10-2020-0066148 | 6/2020 |
| KR | 10-2020-0095340 A | 8/2020 |
| KR | 10-2021-0044364 A | 4/2021 |

* cited by examiner

IMAGE SENSOR WITH PIXEL SEPARATION STRUCTURE

CROSS-REFERENCE TO RELATED APPLICATION

This U.S. nonprovisional application claims priority under 35 U.S.C § 119 to Korean Patent Application No. 10-2021-0057640 filed on May 4, 2021 in the Korean Intellectual Property Office, the disclosure of which is incorporated by reference in its entirety herein.

TECHNICAL FIELD

The present inventive concept relates to an image sensor, and more particularly, to an image sensor with increased integration and improved electrical characteristics.

DISCUSSION OF RELATED ART

An image sensor converts photonic images into electrical signals. Recent advances in computer and communication industries have led to a strong demand for high performances image sensors in various consumer electronic devices such as digital cameras, camcorders, personal communication systems (PCSs), game consoles, security cameras, and medical micro-cameras.

An image sensor includes a charged coupled device (CCD) and a complementary metal oxide semiconductor (CMOS) image sensor. The CMOS image sensor has a simple operating method, and a size of its product is possibly minimized because its signal processing circuit is integrated into a single chip. Also, the CMOS image sensor requires relatively little power, which is useful in a battery-powered application. In addition, since process technology for manufacturing CMOS image sensors is compatible with CMOS process technology, the cost of fabricating CMOS image sensors can be decreased. Accordingly, the use of the CMOS image sensor has been rapidly increasing as a result of advances in technology and demands for high resolution.

SUMMARY

At least one embodiment of the present inventive concept provides an image sensor with increased integration and improved electrical characteristics. However, the inventive concept is not limited thereto and may provide other useful features.

According to an embodiment of the present inventive concept, an image sensor includes a semiconductor substrate having a first surface and a second surface disposed opposite to the first surface; a pixel separation structure disposed in the semiconductor substrate and defining a pixel region, the pixel separation structure surrounding the pixel region in a plan view; first and second photoelectric conversion regions disposed in the semiconductor substrate on the pixel region; a first transfer gate electrode disposed on the first surface of the semiconductor substrate and between the first photoelectric conversion region and a first floating diffusion region; a second transfer gate electrode disposed on the first surface of the semiconductor substrate and between the second photoelectric conversion region and a second floating diffusion region; a pixel gate electrode disposed on the first surface of the semiconductor substrate and overlapping one of the first and second photoelectric conversion regions; and a plurality of impurity regions disposed on opposite sides of the pixel gate electrode.

According to an embodiment of the present inventive concept, an image sensor includes a semiconductor substrate having a first surface and a second surface disposed opposite to the first surface; a pixel separation structure disposed in the semiconductor substrate and defining a pixel region, the pixel separation structure surrounding the pixel region in a plan view; first and second photoelectric conversion regions disposed in the semiconductor substrate on the pixel region and spaced apart from each other in a first direction; a device isolation layer disposed in the first surface of the semiconductor substrate, the device isolation layer defining first and second active portions that overlap the first photoelectric conversion region and third and fourth active portions that overlap the second photoelectric conversion region; first and second transfer gate electrodes disposed on the first and third active portions, respectively; and first and second pixel gate electrodes extending in a first direction and crossing the second and fourth active portions, respectively.

According to an embodiment of the present inventive concept, an image sensor includes a semiconductor substrate having a first surface and a second surface disposed opposite to the first surface; a pixel separation structure that vertically extends from the first surface of the semiconductor substrate and surrounds each of first and second pixel regions; first and second photoelectric conversion regions disposed in the semiconductor substrate disposed on each of the first and second pixel regions, the first and second photoelectric conversion regions being spaced apart from each other in a first direction; a device isolation layer disposed adjacent to the first surface of the semiconductor substrate on each of the first and second pixel regions, the device isolation layer defining first and second active portions that overlap the first photoelectric conversion region and third and fourth active portions that overlap the second photoelectric conversion region; a first transfer gate electrode disposed on the first active portion on each of the first and second pixel regions; a first floating diffusion region disposed in the first active portion on a side of the first transfer gate electrode; a second transfer gate electrode disposed on the third active portion on each of the first and second pixel regions; a second floating diffusion region disposed in the third active portion on a side of the second transfer gate electrode; a first pixel transistor disposed on the second active portion of the first pixel region; a second pixel transistor disposed on the fourth active portion of the first pixel region; a third pixel transistor disposed on the second active portion of the second pixel region; a fourth pixel transistor disposed on the fourth active portion of the second pixel region; a plurality of color filters disposed on the second surface of the semiconductor substrate to correspond to the first and second pixel regions; a grid structure disposed between the color filters and overlapping the pixel separation structure; and a plurality of microlenses disposed on the color filters.

DETAILED DESCRIPTION OF THE EXEMPLARY EMBODIMENTS

The following will now describe in detail an image sensor according to some embodiments of the present inventive concept in conjunction with the accompanying drawings.

Figure 1A:
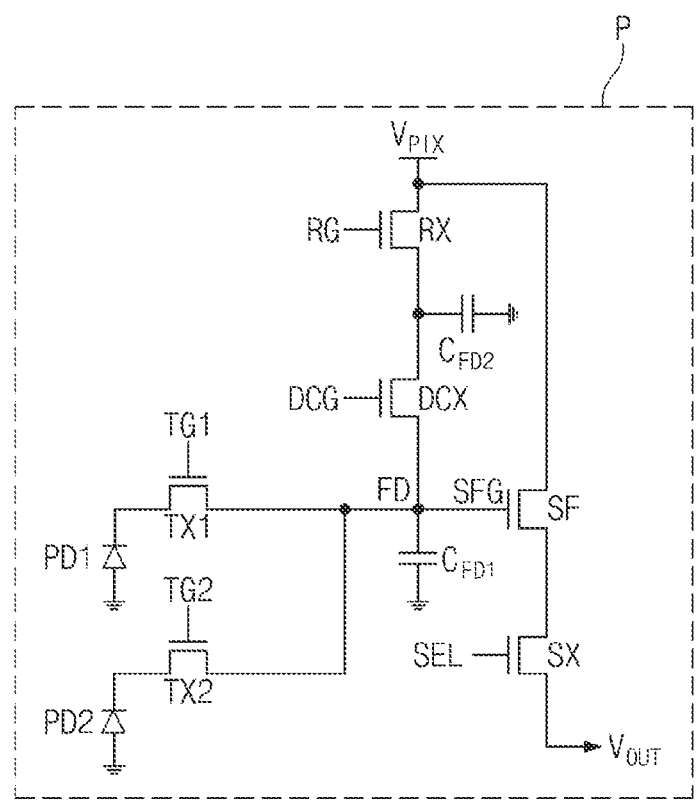
FIGS. 1A and 1B illustrate circuit diagrams showing a unit pixel of a pixel array according to some embodiments of the present inventive concept.
Figure 1B:
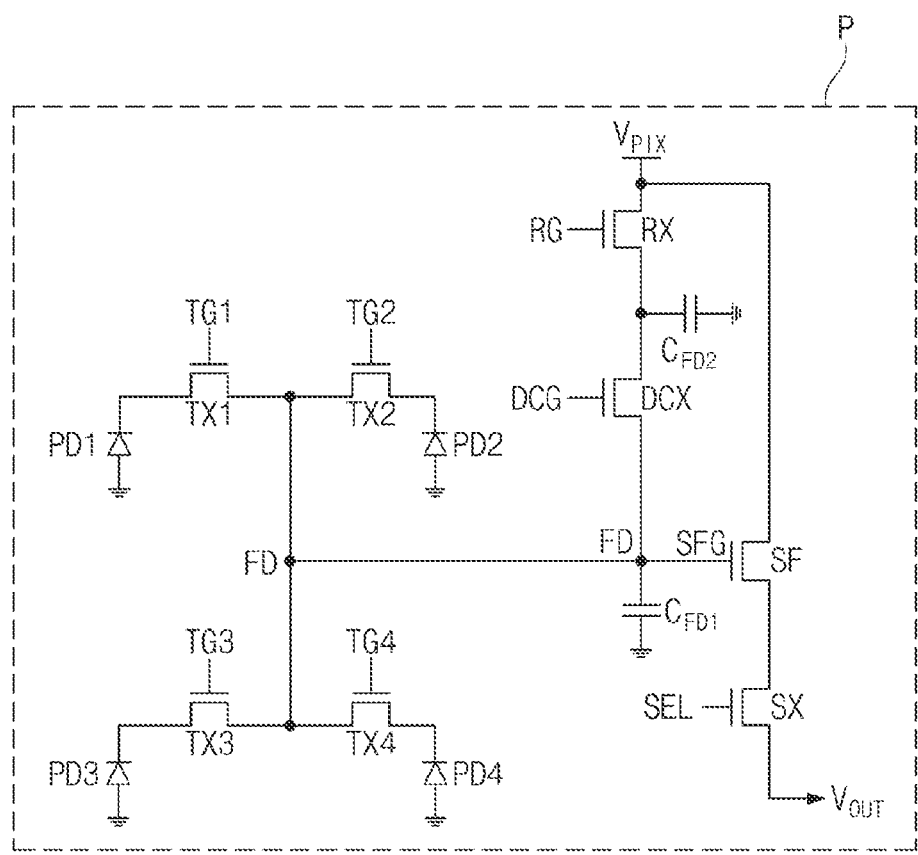

FIGS. 1A and 1B illustrate circuit diagrams showing a unit pixel of a pixel array of the image sensor according to some embodiments of the present inventive concept.

Referring to FIG. 1A, a unit pixel P may include first and second photoelectric conversion elements PD1 and PD2, first and second transfer transistors TX1 and TX2, and four pixel transistors.

The four pixel transistors may include a reset transistor RX, a source follower transistor SF, a selection transistor SX, and a dual conversion gain transistor DCX. Although the unit pixel P is illustrated in FIG. 1A as including four pixel transistors, the present inventive concept is not limited thereto. For example, the unit pixel P may include less than four pixel transistors or more than four pixel transistors in other embodiments.

The first and second photoelectric conversion elements PD1 and PD2 may generate and accumulate charges in proportion to an intensity of incident light. The first and second photoelectric conversion elements PD1 and PD2 may be, for example, one of a photo diode, a photo transistor, a photo gate, a pinned photo diode (PPD), and any combination thereof.

The first and second transfer transistors TX1 and TX2 may provide a charge detection node FD (or floating diffusion region) with charges accumulated in the first and second photoelectric conversion elements PD1 and PD2. The first and second transfer transistors TX1 and TX2 may be controlled with first and second transfer signals. For example, the first and second transfer signals may be supplied to respective gate electrodes of the transfer transistors by a control circuit of the image sensor.

The first and second transfer transistors TX1 and TX2 may share the charge detection node FD (or floating diffusion region).

In response to the first transfer signal applied to a first transfer gate electrode TG1, the first transfer transistor TX1 may provide the charge detection node FD (or floating diffusion region) with charges accumulated in the first photoelectric conversion element PD1.

In response to the second transfer signal applied to a second transfer gate electrode TG2, the second transfer transistor TX2 may provide the charge detection node FD (or floating diffusion region) with charges accumulated in the second photoelectric conversion element PD2.

The charge detection node FD may receive and accumulate charges generated from the first and second photoelectric conversion elements PD1 and PD2. The source follower transistor SF may be controlled in accordance with an amount of photo-charges accumulated in the charge detection node FD.

In response to a reset signal applied to a reset gate electrode RG, the reset transistor RX may periodically reset charges accumulated in the charge detection node FD. For example, the reset transistor RX may have a drain terminal connected to the dual conversion gain transistor DCX or the charge detection node FD, and may also have a source terminal connected to a node receiving a pixel power voltage $V_{PIX}$. When the reset transistor RX and the dual conversion gain transistor DCX are turned on, the pixel power voltage $V_{PIX}$ may be transferred to the charge detection node FD. Therefore, charges accumulated in the charge detection node FD may be discharged to reset the charge detection node FD.

The dual conversion gain transistor DCX may be connected between the charge detection node FD and the reset transistor RX. In response to a dual conversion gain control signal applied to the dual conversion gain gate electrode DCG, the dual conversion gain transistor DCX may change a capacitance of the charge detection node FD to thereby change a conversion gain of the unit pixel P.

For example, when an image is captured, a pixel array may receive light of high and low illumination levels, and the dual conversion gain transistor DCX may be turned on in a high illumination mode and turned off in a low illumination mode. The dual conversion gain transistor DCX may provide a difference in conversion gain between the high and low illumination modes.

When the dual conversion gain transistor DCX is turned off, a capacitance of the charge detection node FD may correspond to a first capacitance $C_{FD1}$. When the dual conversion gain transistor DCX is turned on, a capacitance of the charge detection node FD may increase to the sum of a first capacitance $C_{FD1}$ and a second capacitance $C_{FD2}$. For example, when the dual conversion gain transistor DCX is turned on, a capacitance of the charge detection node FD may increase to reduce the conversion gain, and when the dual conversion gain transistor DCX is turned off, a capacitance of the charge detection node FD may decrease to increase the conversion gain.

The source follower transistor SF may be a source follower buffer amplifier that generates a source-drain current in proportion to an amount of charges applied to a source follower gate electrode SFG from the charge detection node FD. The source follower transistor SF may amplify a variation in electrical potential of the charge detection node FD and may output the amplified signal through the selection transistor SX to an output line $V_{OUT}$. The source follower transistor SF may have a source terminal connected to a node receiving the pixel power voltage $V_{PIX}$ (and a drain terminal connected to a source terminal of the selection transistor SX.

The selection transistor SX may select each row of the unit pixel P to be readout. When the selection transistor SX is turned on in response to a selection signal applied to a selection gate electrode SEL, the output line $V_{OUT}$ may output an electrical signal that is output from the drain terminal of the source follower transistor SF.

Referring to FIG. 1B, a unit pixel P may include first, second, third, and fourth photoelectric conversion elements PD1, PD2, PD3, and PD4; first, second, third, and fourth transfer transistors TX1, TX2, TX3, and TX4; and four pixel transistors RX, DCX, SF, and SX.

The first, second, third, and fourth transfer transistors TX1, TX2, TX3, and TX4 may share a charge detection node FD. The first, second, third, and fourth transfer transistors TX1, TX2, TX3, and TX4 may have respective first, second, third, and fourth transfer gate electrodes TG1, TG2, TG3, and TG4 that are controlled with first, second, third, and fourth transfer signals, respectively.

Figure 2:
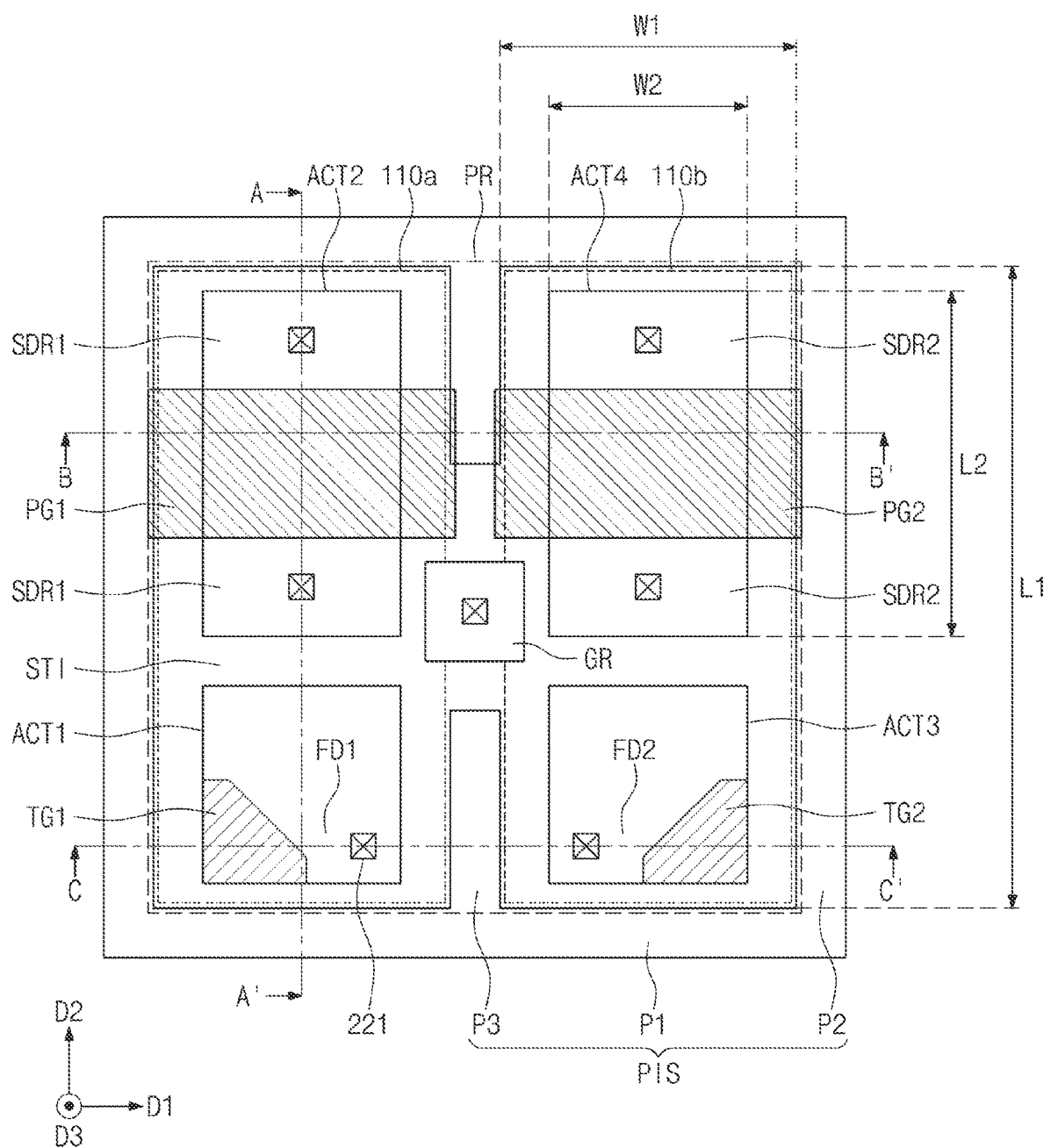
FIG. 2 illustrates a plan view showing a unit pixel of an image sensor according to an embodiment of the present inventive concept.
Figure 3A:
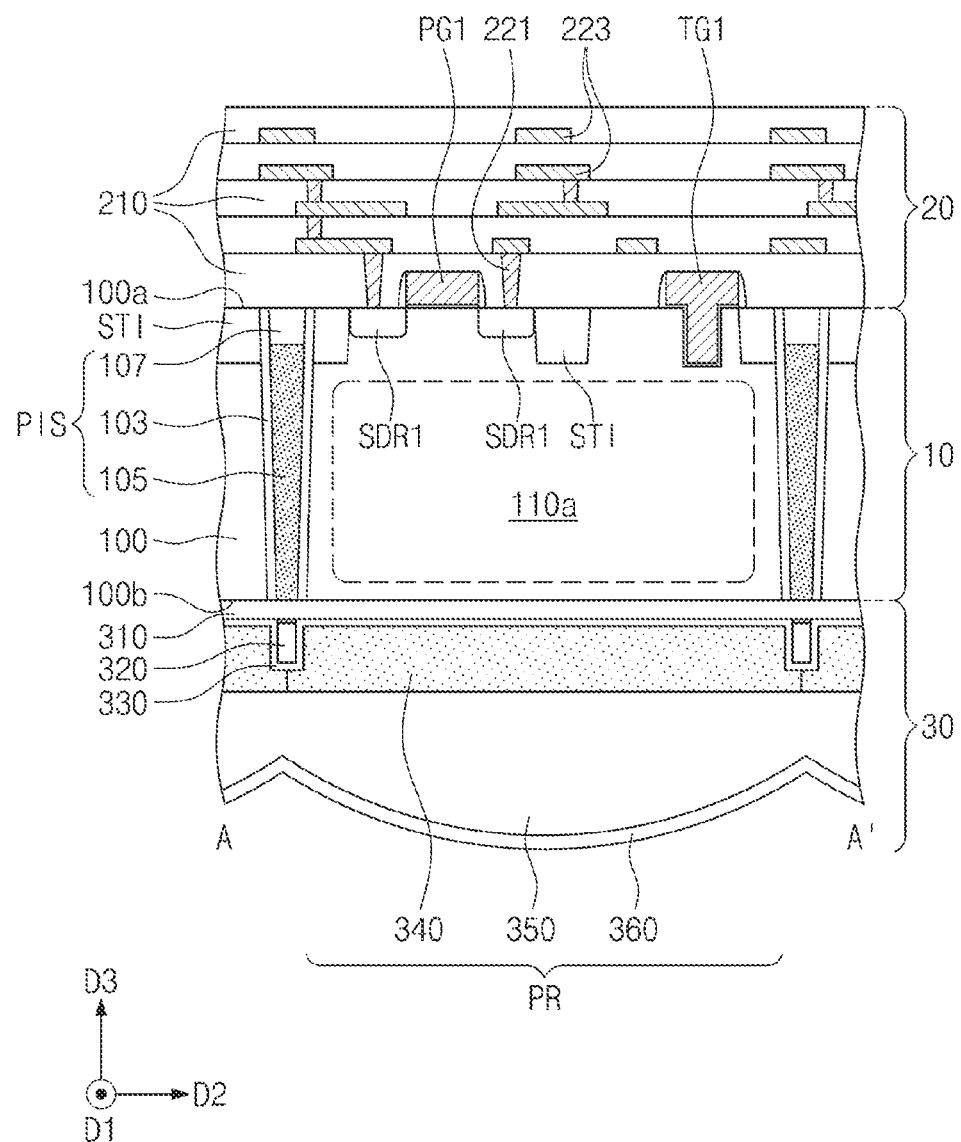
FIGS. 3A, 3B, and 3C illustrate cross-sectional views respectively taken along lines A-A', B-B', and C-C' of FIG. 2, showing an image sensor according to some embodiments of the present inventive concept.
Figure 3B:
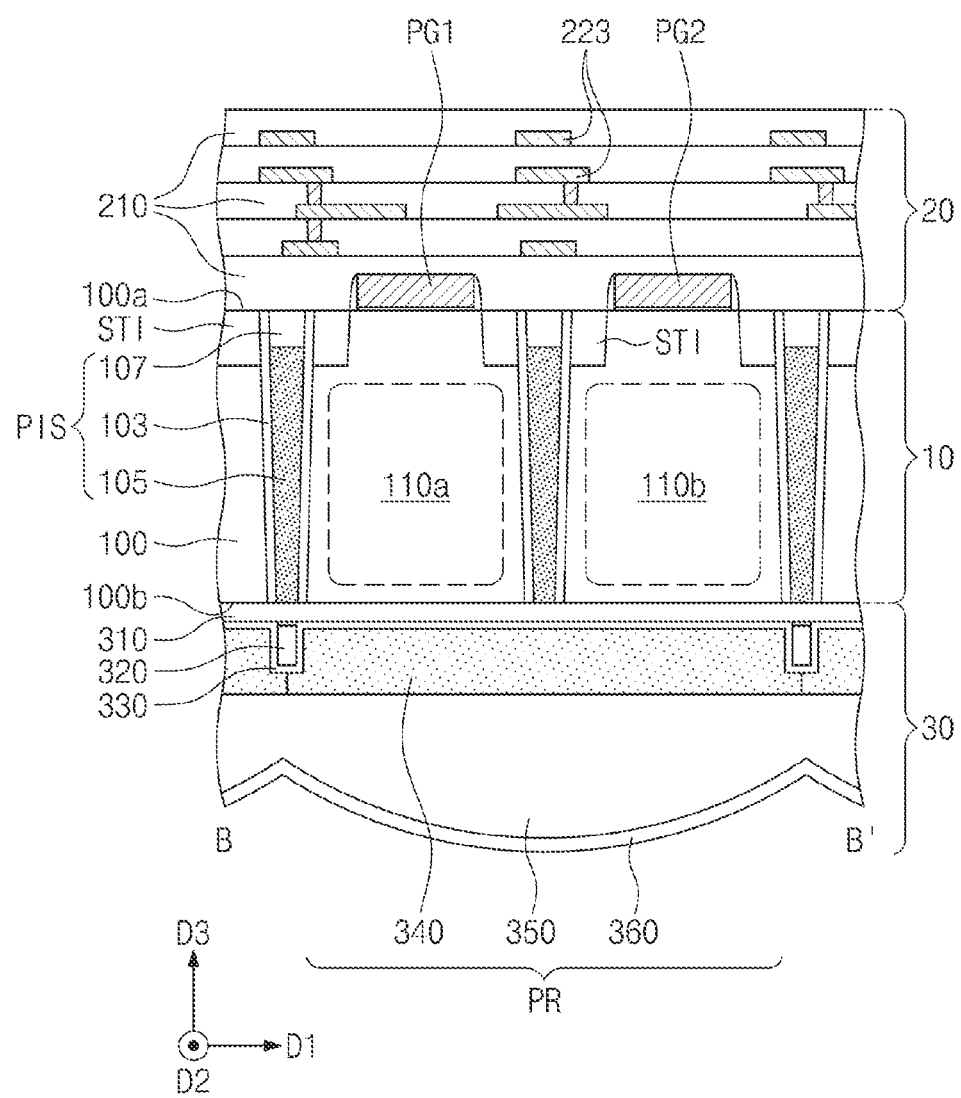
Figure 3C:
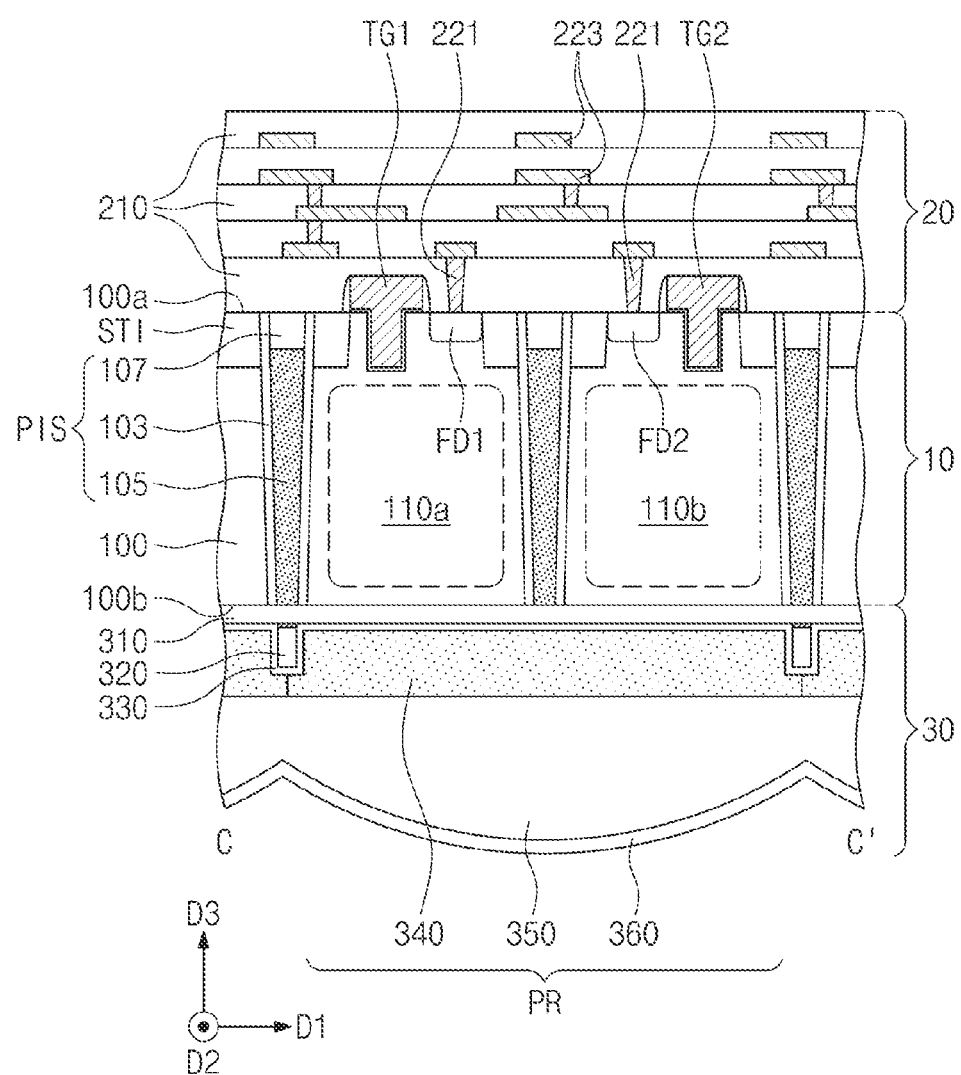

FIG. 2 illustrates a plan view showing a unit pixel of an image sensor according to an embodiment of the present inventive concept. FIGS. 3A, 3B, and 3C illustrate cross-sectional views respectively taken along lines A-A', B-B', and C-C' of FIG. 2, showing an image sensor according to some embodiments of the present inventive concept.

Referring to FIGS. 2, 3A, 3B, and 3C, an image sensor according to the present inventive concept may include a photoelectric conversion layer 10, a readout circuit layer 20, and an optical transmission layer 30, when viewed in a cross-section or in a plan view.

When viewed in a cross-section, the photoelectric conversion layer 10 may be located between the readout circuit layer 20 and the optical transmission layer 30. The photoelectric conversion layer 10 may convert externally incident light into electrical signals. The photoelectric conversion layer 10 may include a semiconductor substrate 100, a pixel separation structure PIS, and first and second photoelectric conversion regions 110a and 110b.

For example, the semiconductor substrate 100 may have a first surface (or front surface) 100a and a second surface (or rear surface) 100b that are opposite to each other. The semiconductor substrate 100 may be an epitaxial layer formed on a bulk silicon substrate that has the same first conductivity type (e.g., p-type) as that of the epitaxial layer, or a p-type epitaxial layer from which a bulk silicon substrate is removed in fabrication of the image sensor. Alternatively, the semiconductor substrate 100 may be a bulk semiconductor substrate that includes a well of the first conductivity type.

The semiconductor substrate 100 may be provided therein with the pixel separation structure PIS that defines a pixel region PR. For example, the pixel separation structure PIS may be located within the semiconductor substrate 100. When viewed in a plan view, the pixel separation structure PIS may surround the pixel region PR. For example, the pixel separation structure PIS may include first portions P1 that extend in parallel along a first direction D1, second portions P2 that extend in parallel along a second direction D2 and cross the first portions P1, and third portions P3 that protrude in the second direction D2 from the first portions P1. An interval between the first portions P1 may be substantially the same as that between the second portions P2. The third portions P3 may protrude toward a center of the pixel region PR, and may face each other.

In an embodiment, the pixel separation structure PIS has a top surface substantially coplanar or precisely coplanar with the first surface 100a of the semiconductor substrate 100. In an embodiment, the top surface of the pixel separation structure PIS is substantially coplanar or precisely coplanar with a top surface of a device isolation layer STI which will be discussed below.

In an embodiment, the pixel separation structure PIS is formed of a dielectric material whose refractive index is less than that of the semiconductor substrate 100 (e.g., silicon). The dielectric material may include a single or a plurality of dielectric layers. The pixel separation structure PIS may be formed of, for example, a silicon oxide layer, a silicon nitride layer, an undoped polysilicon layer, air, or a combination thereof.

For example, the pixel separation structure PIS may include a linear dielectric pattern 105, a semiconductor pattern 103, and a capping dielectric pattern 107. The pixel separation structure PIS may be formed by patterning the first surface 100a and/or the second surface 100b of the semiconductor substrate 100 to form a deep trench, and then filling the deep trench with a linear dielectric layer and an impurity-doped semiconductor layer.

The pixel separation structure PIS may penetrate the semiconductor substrate 100. For example, the pixel separation structure PIS may have a first length in a direction (or third direction D3) perpendicular to a surface of the semiconductor substrate 100, and the first length may be substantially the same as a vertical thickness of the semiconductor substrate 100. In another example, the pixel separation structure PIS may vertically extend from the first surface 100a toward the second surface 100b of the semiconductor substrate 100, and may be spaced apart from the second surface 100b of the semiconductor substrate 100. For example, while FIG. 3A shows a bottom surface of the pixel separation structure PIS contacting the second surface 100b, in an alternate embodiment, the height of the pixel separation structure PIS may be reduced so that it does not contact the second surface 100b.

The pixel separation structure PIS has a first width adjacent to the first surface 100a of the semiconductor substrate 100 and a second width adjacent to the second surface 100b of the semiconductor substrate 100. In an embodiment, the first width is greater than the second width. The pixel separation structure PIS may have a width that gradually increases in a direction from the second surface 100b toward the first surface 100a of the semiconductor substrate 100.

The pixel separation structure PIS may prevent photocharges generated from light incident onto the pixel region PR from randomly drifting into neighboring pixel regions PR. The pixel separation structure PIS may help prevent cross-talk between neighboring pixel regions PR.

According to an embodiment, on each pixel region PR, the first and second photoelectric conversion regions 110a and 110b may be provided in the semiconductor substrate 100. The first and second photoelectric conversion regions 110a and 110b may convert externally incident light into electrical signals.

The first and second photoelectric conversion regions 110a and 110b may be impurity areas each of which is doped with impurities having a second conductivity type (e.g., n-type) opposite to the first conductivity type of the semiconductor substrate 100. The semiconductor substrate 100 of the first conductivity type and the first and second photoelectric conversion regions 110a and 110b of the second conductivity type may constitute a pair of photodiodes. For example, a photodiode may be formed by a junction between the semiconductor substrate 100 of the first conductivity type and one of the first and second photoelectric conversion regions 110a and 110b of the second conductivity type. The first and second photoelectric conversions regions 110a and 110b each constituting a photodiode may generate and accumulate photo-charges in proportion to an intensity of incident light.

On each pixel region PR, a phase difference may be provided between an electrical signal that is output from the first photoelectric conversion region 110a and an electrical signal that is output from the second photoelectric conversion region 110b. The image sensor may compare the phase difference between the electrical signals that are output from a pair of first and second photoelectric conversion regions 110a and 110b to thereby measure a distance from an object, to determine whether the object is in focus or not, and to decide how much the object is out of focus, with the result that correction in focus may be automatically executed.

Each of the first and second photoelectric conversion regions 110a and 110b have a first width in the first direction D1 and have a first length in the second direction D2. In an embodiment, the first length is greater than the first width. For example, the first length may be about twice the first width.

According to some embodiments, the first and second photoelectric conversion regions 110a and 110b may be spaced apart from each other in the first direction D1 across the third portions P3 of the pixel separation structure PIS. The third portions P3 of the pixel separation structure PIS may physically reflect incident light at an edge of each pixel region PR, and may thus reduce cross-talk between the first and second photoelectric conversion regions 110a and 110b on each pixel region PR.

A device isolation layer STI may be located adjacent to the first surface 100a of the semiconductor substrate 100 on each pixel region PR. The device isolation layer STI may have a bottom surface spaced apart from the first and second photoelectric conversion regions 110a and 110b.

The device isolation layer STI may be provided in a trench that is formed by recessing the first surface 100a of the semiconductor substrate 100. For example, the trench may be formed in the semiconductor substrate 100 by removing as portion of the semiconductor substrate 100. In an embodiment, the device isolation layer STI is formed of a dielectric material. For example, the device isolation layer STI may include a linear oxide layer and a linear nitride layer that conformally cover a surface of the trench, and may also include a filling oxide layer that fills the trench in which the linear oxide layer and the linear nitride layer are formed. In an embodiment, the device isolation layer STI has a top surface substantially coplanar or precisely coplanar with the first surface 100a of the semiconductor substrate 100. In addition, the top surface of the device isolation layer STI may be substantially coplanar with that of the pixel separation structure PIS.

According to some embodiments, the device isolation layer STI may define first, second, third, and fourth active portions ACT1, ACT2, ACT3, and ACT4 on each pixel region PR. When viewed in a plan view, the first and second active portions ACT1 and ACT2 may overlap the first photoelectric conversion region 110a, and the third and fourth active portions ACT3 and ACT4 may overlap the second photoelectric conversion region 110b.

For example, the first active portion ACT1 and the second active portion ACT2 may be spaced apart from each other in the second direction D2 across the device isolation layer STI, and may have different sizes and shapes. In addition, the third active portion ACT3 and the fourth active portion ACT4 may be spaced apart from each other in the second direction D2 across the device isolation layer STI, and may have different sizes and shapes.

The third portions P3 of the pixel separation structure PIS may be located between the first active portion ACT1 and the third active portion ACT3 and between the second active portion ACT2 and the fourth active portion ACT4.

In an embodiment, the first active portion ACT1 and the third active portion ACT3 have substantially the same size and shape or precisely the same size and shape. In some embodiments, although the first and third active portions ACT1 and ACT3 are illustrated to each have a tetragonal shape, the present inventive concept is not limited thereto, and the first and third active portions ACT1 and ACT3 may each have various polygonal shapes.

In an embodiment, the second active portion ACT2 and the fourth active portion ACT4 have substantially the same size and shape or precisely the same size and shape. For example, each of the second and fourth active portions ACT2 and ACT4 may have a major axis in the second direction D2 and a minor axis in the first direction D1. In an embodiment, each of the second and fourth active portions ACT2 and ACT4 have a second width W2 in the first direction D1 less than a first width W1 in the first direction D1 of one of the first and second photoelectric conversion regions 110a and 110b. In addition, in an embodiment, each of the second and fourth active portions ACT2 and ACT4 have a second length L2 in the second direction D2 less than a first length L1 in the second direction D2 of one of the first and second photoelectric conversion regions 110a and 110b.

The readout circuit layer 20 may be disposed on the first surface 100a of the semiconductor substrate 100. The readout circuit layer 20 may include readout circuits connected to the photoelectric conversion layer 10. For example, the readout circuit layer 20 may include transfer gate electrodes TG1 and TG2 and pixel transistors (e.g., the reset transistor RX, the source follower transistor SF, the dual conversion gain transistor DCX, and the selection transistor SX that are shown in FIG. 1A or 1B).

For example, the first active portion ACT1 may be provided thereon with a first transfer gate electrode TG1 and a first floating diffusion region FD1 on one side of the first transfer gate electrode TG1. The third active portion ACT3 may be provided thereon with a second transfer gate electrode TG2 and a second floating diffusion region FD2 on one side of the second transfer gate electrode TG2.

Portions of the first and second transfer gate electrodes TG1 and TG2 may be located in a trench that is formed by recessing the first surface 100a of the semiconductor substrate 100, and a gate dielectric layer may be interposed between the semiconductor substrate 100 and the first and second transfer gate electrodes TG1 and TG2. In some embodiments, the first and second transfer gate electrodes TG1 and TG2 may be variously changed in shape and position. The first and second transfer gate electrodes TG1 and TG2 may have their flat bottom surfaces on the first surface 100a of the semiconductor substrate 100. For example, a height of the first and second transfer gate electrodes TG1 and TG2 shown in FIG. 3C may be reduced so that their bottom surfaces are level with the first surface 100a. The first active portion ACT1 may have different areas on opposite sides of each of the first and second transfer gate electrodes TG1 and TG2. For example, first and second transfer transistors may each have a source region and a drain region that have different widths from each other.

The first and second floating diffusion regions FD1 and FD2 may be formed by doping impurities having a conductivity type different from that of the semiconductor substrate 100. For example, the first and second floating diffusion regions FD1 and FD2 may be n-type impurity regions.

According to an embodiment and as shown in FIG. 3B, a first pixel gate electrode PG1 may be located on the second active portion ACT2, and a second pixel gate electrode PG2 may be located on the fourth active portion ACT4. For example, the first pixel gate electrode PG1 may overlap the first photoelectric conversion region 110a, and the second pixel gate electrode PG2 may overlap the second photoelectric conversion region 110b.

First impurity regions SDR1 may be provided in the second active portion ACT2 on opposite sides of the first pixel gate electrode PG1, and second impurity regions SDR2 may be provided in the fourth active portions ACT4 on opposite sides of the second pixel gate electrode PG2.

The first impurity regions SDR1 may be spaced apart from each other in the second direction D2, and the first pixel gate electrode PG1 may be disposed between the first impurity regions SDR1. Likewise, the second impurity regions SDR2 may be spaced apart from each other in the second direction D2, and the second pixel gate electrode PG2 may be disposed between the second impurity regions SDR2.

The first pixel gate electrode PG1 and the first impurity regions SDR1 may constitute one of the pixel transistors, for example, the reset transistor RX, the source follower transistor SF, the dual conversion gain transistor DCX, and the selection transistor SX that are discussed above with reference to FIGS. 1A and 1B Likewise, the second pixel gate electrode PG2 and the second impurity regions SDR2 may constitute another one of the pixel transistors, for example, the reset transistor RX, the source follower transistor SF, the dual conversion gain transistor DCX, and the selection transistor SX that are discussed above with reference to FIGS. 1A and 1B.

In addition, a ground impurity region GR may be provided between the first and second photoelectric conversion regions 110a and 110b. The device isolation layer STI may separate the ground impurity region GR from the first, second, third, and fourth active portions ACT1, ACT2, ACT3, and ACT4. The ground impurity region GR may be formed by doping impurities having the same conductivity type as that of the semiconductor substrate 100.

As shown in FIG. 3A, interlayer dielectric layers 210 may be stacked on the first surface 100a of the semiconductor substrate 100, and may cover the transfer gate electrodes TG1 and TG2 and the pixel transistors RX, SF, DCX, and SX that constitute the readout circuits. The interlayer dielectric layers 210 may include, for example, one or more of silicon oxide, silicon nitride, and silicon oxynitride.

The interlayer dielectric layers 210 may have therein wiring structures 221 and 223 connected to the readout circuits. The wiring structures 221 and 223 may include metal lines 223 and contact plugs 221 that connect the metal lines 223 to each other.

Referring to FIGS. 3A, 3B, and 3C, the optical transmission layer 30 may be located on the second surface 100b of the semiconductor substrate 100. The optical transmission layer 30 may include a planarized dielectric layer 310, a grid structure 320, a protection layer 330, color filters 340, microlenses 350, and a passivation layer 360. The optical transmission layer 30 may focus and filter externally incident light, and the photoelectric conversion layer 10 may be provided with the focused and filtered light.

The planarized dielectric layer 310 may cover the second surface 100b of the semiconductor substrate 100. In an embodiment, the planarized dielectric layer 310 is formed of a transparent material and may include a plurality of layers. In an embodiment, the planarized dielectric layer 310 is formed of a dielectric material whose refractive index is different from that of the semiconductor substrate 100. The planarized dielectric layer 310 may include one or more of metal oxide and silicon oxide.

The grid structure 320 may be located on the planarized dielectric layer 310. Similar to the pixel separation structure PIS, the grid structure 320 may have a grid or mesh shape when viewed in a plan view. When viewed in a plan view, the grid structure 320 may overlap the pixel separation structure PIS. For example, the grid structure 320 may include first parts that extend in the first direction D1, and may also include second parts that extend in the second direction D2 and cross the first parts. The grid structure 320 may have a width substantially the same as or less than a minimum width of the pixel separation structure PIS.

The grid structure 320 may include one or more of a conductive pattern and a low-refractive pattern. The conductive pattern may include a metallic material, such as titanium, tantalum, or tungsten. In an embodiment, the low-refractive pattern is formed of a material whose refractive index is less than that of the conductive pattern. The low-refractive pattern may be formed of an organic material and may have a refractive index of about 1.1 to about 1.3. For example, the grid structure 320 may be a polymer layer including silica nano-particles.

The planarized dielectric layer 310 may be provided thereon with the protection layer 330 having a substantially uniform thickness that covers a surface of the grid structure 320. The protection layer 330 may be a single or multiple layer including, for example, at least one selected from aluminum oxide and silicon carbon oxide.

The color filters 340 may be formed to correspond to the pixel regions PR. The color filters 340 may fill spaces defined by the grid structure 320. Based on a unit pixel, the color filter 340 may include one of red, green, and blue filters or one of magenta, cyan, and yellow color filters. Alternatively, one or some of the color filters 340 may include a white color or an infrared color filter.

The microlenses 350 may be located on the color filters 340. The microlenses 350 may each have a convex shape with a certain curvature radius. The microlenses 350 may be formed of a light-transmitting resin. The color filters 340 may be provided thereon with the microlenses 350 that correspond to the pixel regions PR. Alternatively, at least one of the microlenses 350 may be located in common on at least two pixel regions PR. For example, a single microlense 350 could overlap more than one of the pixel regions PR.

The passivation layer 360 may conformally cover surfaces of the microlenses 350. The passivation layer 360 may include, for example, inorganic oxide.

The following will describe an image sensor according to an embodiment of the present inventive concept, and for brevity of description, a description of the same technical features as those of the image sensor discussed with reference to FIGS. 2, 3A, 3B, and 3C will be omitted and a difference thereof will be explained.

Figure 4:
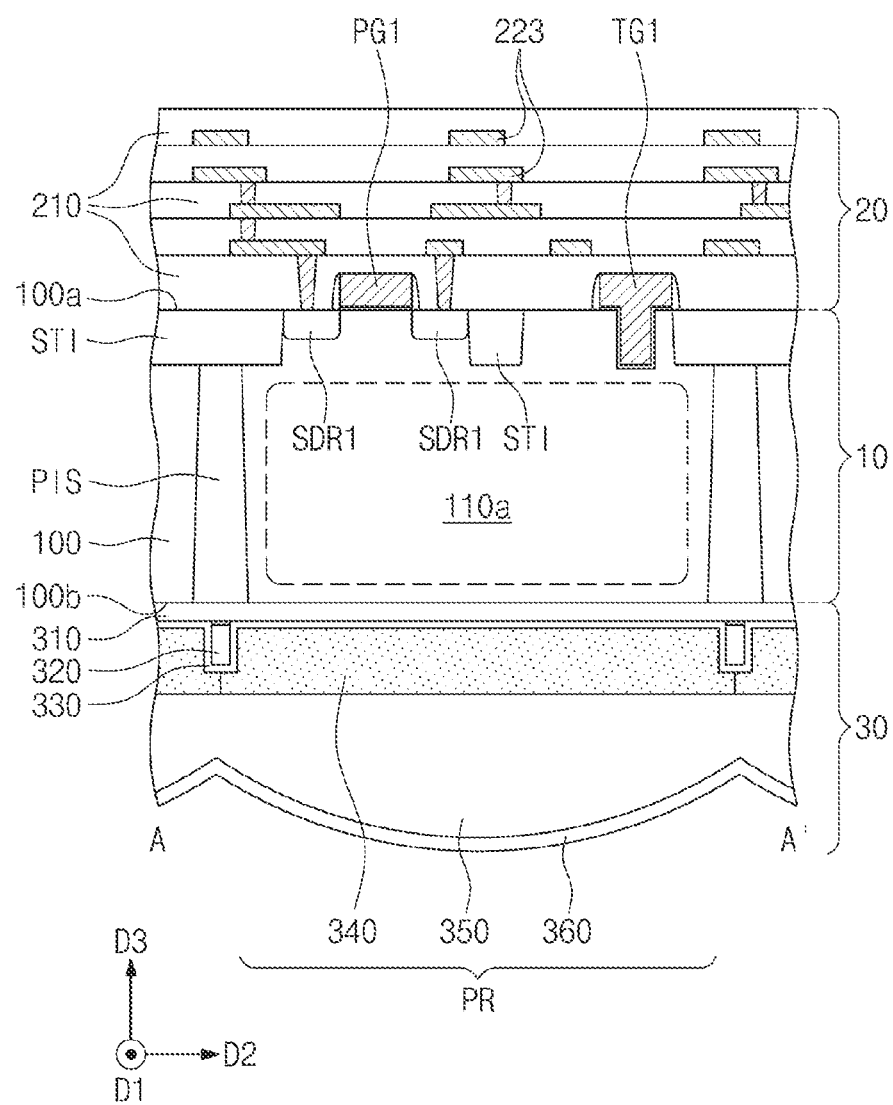
FIGS. 4, 5, and 6 illustrate cross-sectional views taken along line A-A' of FIG. 2, showing an image sensor according to some embodiments of the present inventive concept.
Figure 5:
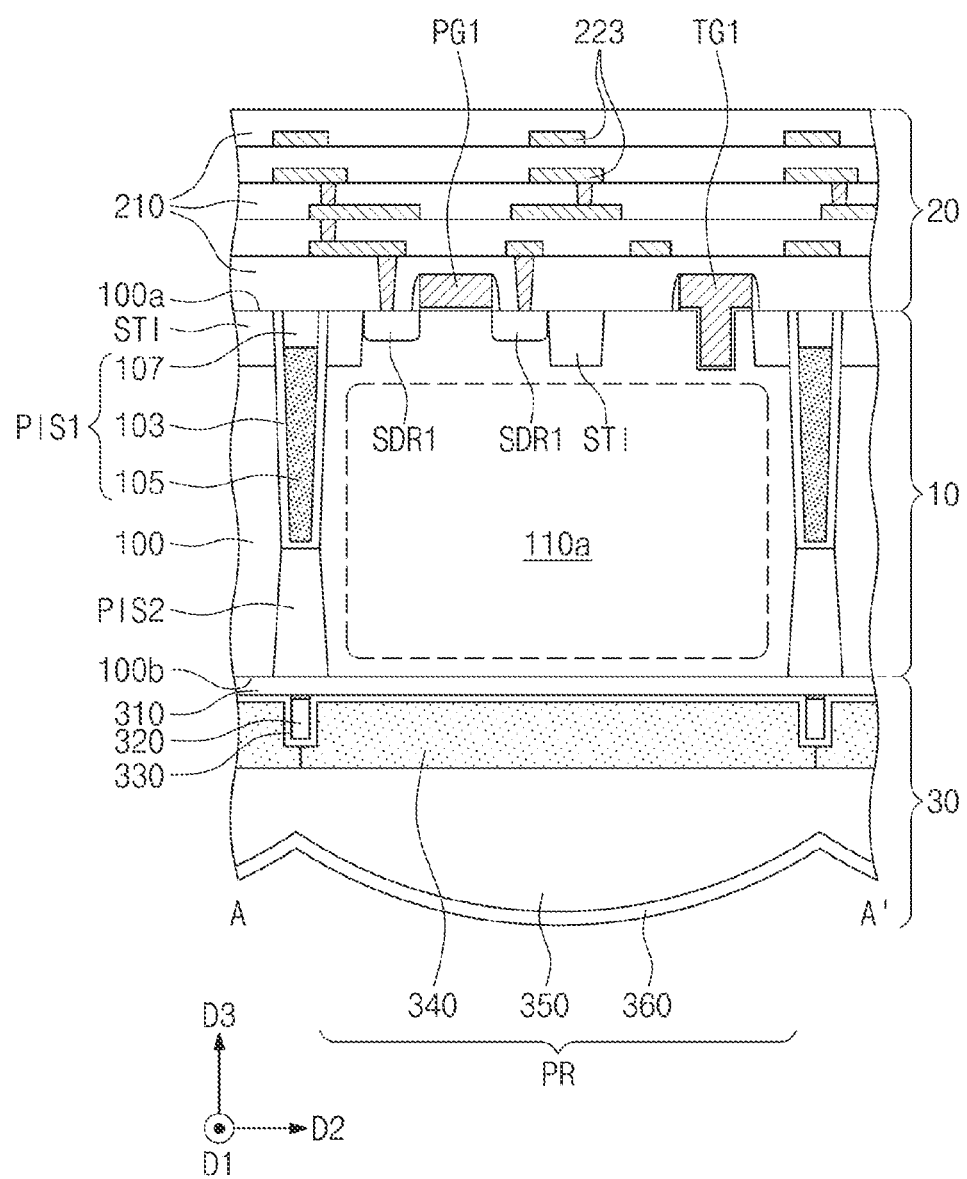
Figure 6:
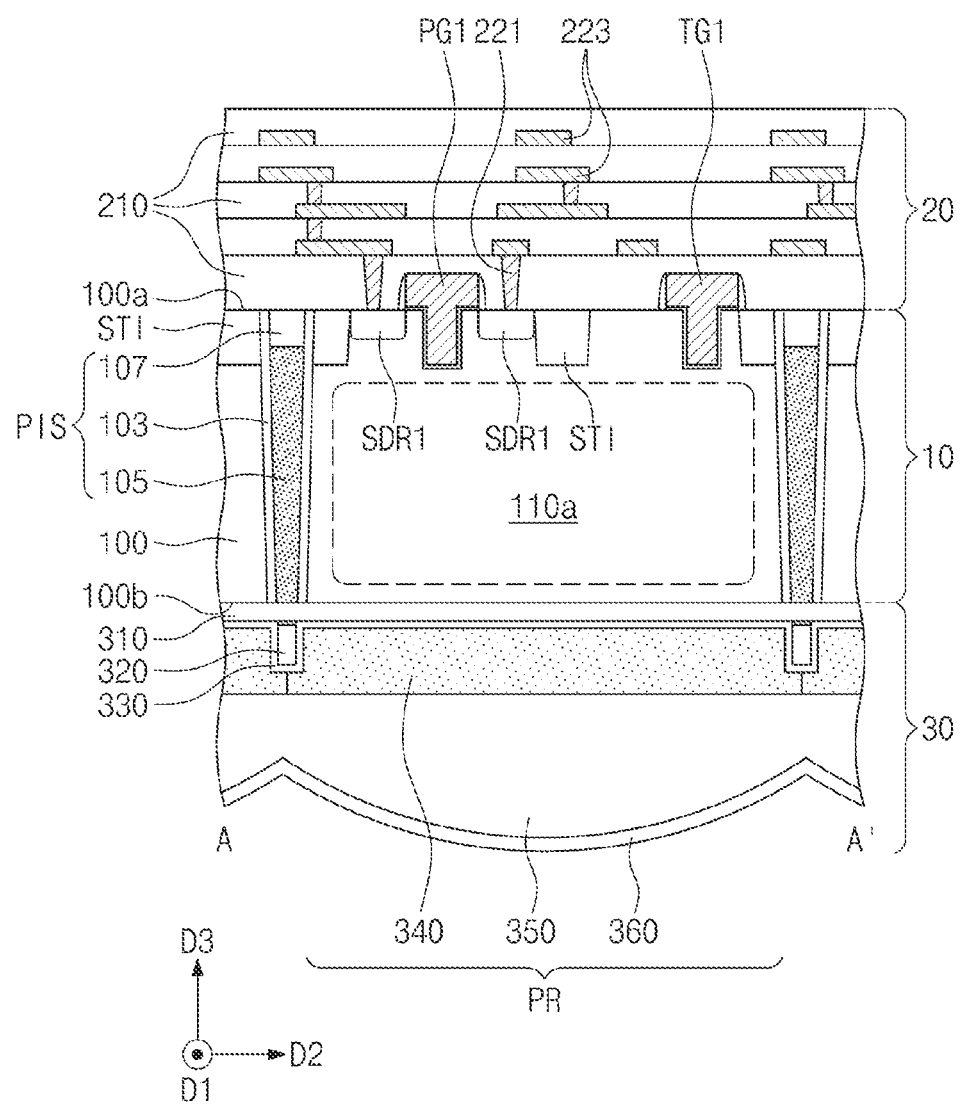

FIGS. 4, 5, and 6 illustrate cross-sectional views taken along line A-A' of FIG. 2, showing an image sensor according to some embodiments of the present inventive concept.

According to the embodiment shown in FIG. 4, the pixel separation structure PIS may have a first lower width adjacent to its bottom surface close to the first surface 100a of the semiconductor substrate 100, and may also have a first upper width adjacent to the second surface 100b of the semiconductor substrate 100, where the first upper width may be greater than the first lower width. For example, the pixel separation structure PIS may have a width that gradually decreases in a direction from the second surface 100b toward the first surface 100a of the semiconductor substrate 100.

The pixel separation structure PIS may have a top surface substantially coplanar with the second surface 100b of the semiconductor substrate 100. The pixel separation structure PIS may have a first length in a direction (or the third direction D3) perpendicular to a surface of the semiconductor substrate 100, and the first length may be substantially the same or precisely the same as a vertical thickness of the semiconductor substrate 100.

The pixel separation structure PIS may have a bottom surface in contact with a portion of the device isolation layer STI. Alternatively, the pixel separation structure PIS may have a bottom surface vertically spaced apart from the device isolation layer STI. For example, the height of the pixel separation structure PIS shown in FIG. 4 may be reduced so that it does not contact the device isolation layer STI.

The pixel separation structure PIS may be formed by allowing a dielectric material to fill a trench that is recessed from the second surface 100b of the semiconductor substrate 100. In an embodiment, the pixel separation structure PIS is formed of at least one high-k dielectric layer whose dielectric constant is greater than that of a silicon oxide layer.

According to the embodiment shown in FIG. 5, an image sensor may include a first pixel separation structure PIS1 and a second pixel separation structure PIS2 that define the pixel region PR.

The first pixel separation structure PIS1 may include features substantially the same as those of the pixel separation structure PIS discussed with reference to FIGS. 2, 3A, 3B, and 3C. For example, the first pixel separation structure PIS1 may be provided in the semiconductor substrate 100, while extending in a vertical direction (or the third direction D3) from the first surface 100a of the semiconductor substrate 100.

The second pixel separation structure PIS2 may be provided in the semiconductor substrate 100, while extending in a vertical direction (or the third direction D3) from the second surface 100b of the semiconductor substrate 100. The second pixel separation structure PIS2 may be provided in a trench that is recessed from the second surface 100b of the semiconductor substrate 100.

The second pixel separation structure PIS2 may have a planar structure substantially the same as that of the first pixel separation structure PIS1. When viewed in a plan view, the second pixel separation structure PIS2 may overlap the first pixel separation structure PIS1. For example, the second pixel separation structure PIS2 may include first portions (see P1 of FIG. 2) that extend in the first direction D1, and may also include second portions (see P2 of FIG. 2) that extend along the second direction D2 and intersect the first portions P1.

The second pixel separation structure PIS2 may have a bottom surface between the first surface 100a and the second surface 100b of the semiconductor substrate 100. For example, the second pixel separation structure PIS2 may be spaced apart from the first surface 100a of the semiconductor substrate 100. The second pixel separation structure PIS2 may be in contact with the first pixel separation structure PIS1.

The second pixel separation structure PIS2 may have a second upper width at the second surface 100b of the semiconductor substrate 100 and a second lower width at the bottom surface of the second pixel separation structure PIS2. The second lower width may be substantially the same as or less than the second upper width. In an embodiment, the second pixel separation structure PIS2 has a width that gradually decreases in a direction from the second surface 100b toward the first surface 100a of the semiconductor substrate 100.

The second pixel separation structure PIS2 may have a second length in a vertical direction (or the third direction D3), and the second length may be the same or different from a first length of the first pixel separation structure PIS1. For example, the second length of the second pixel separation structure PIS2 may be substantially the same as the first length of the first pixel separation structure PIS1.

In an embodiment, the second pixel separation structure PIS2 is formed of at least one high-k dielectric layer whose dielectric constant is greater than that of a silicon oxide layer.

According to the embodiment shown in FIG. 6, as discussed above with reference to FIG. 2, the first and second pixel gate electrodes PG1 and PG2 may be located respectively on the first and second photoelectric conversion regions 110a and 110b. Each of the first and second pixel gate electrodes PG1 and PG2 may be disposed in a trench that is formed by recessing the first surface 100a of the semiconductor substrate 100. For example, each of the first and second pixel gate electrodes PG1 and PG2 may have a bottom surface at a level lower than that of the first surface 100a of the semiconductor substrate 100. The bottom surfaces of the first and second pixel gate electrodes PG1 and PG2 may be located at substantially the same level or precisely the same level as that of bottom surfaces of the first and second transfer gate electrodes TG1 and TG2.

Since the first and second pixel gate electrodes PG1 and PG2 are partially recessed into the semiconductor substrate 100, even when an area of the pixel region PR is reduced, the pixel transistors may securely obtain effective channel lengths in the second direction D2. For example, even though the pixel region PR has a reduced area, it may be possible to optimize electrical characteristics of the pixel transistors.

In some embodiments, the first and second pixel gate electrodes PG1 and PG2 may have the same shape, but the present inventive concepts are not limited thereto. The same shape of the first and second pixel gate electrodes PG1 and PG2 may be changed based on functions of the pixel transistors. For example, on each pixel region PR, the first and second pixel gate electrodes PG1 and PG2 may have different shapes from each other. For example, the first pixel gate electrode PG1 may be a planar gate electrode, and the second pixel gate electrode PG2 may be a recessed gate electrode.

Figure 7:
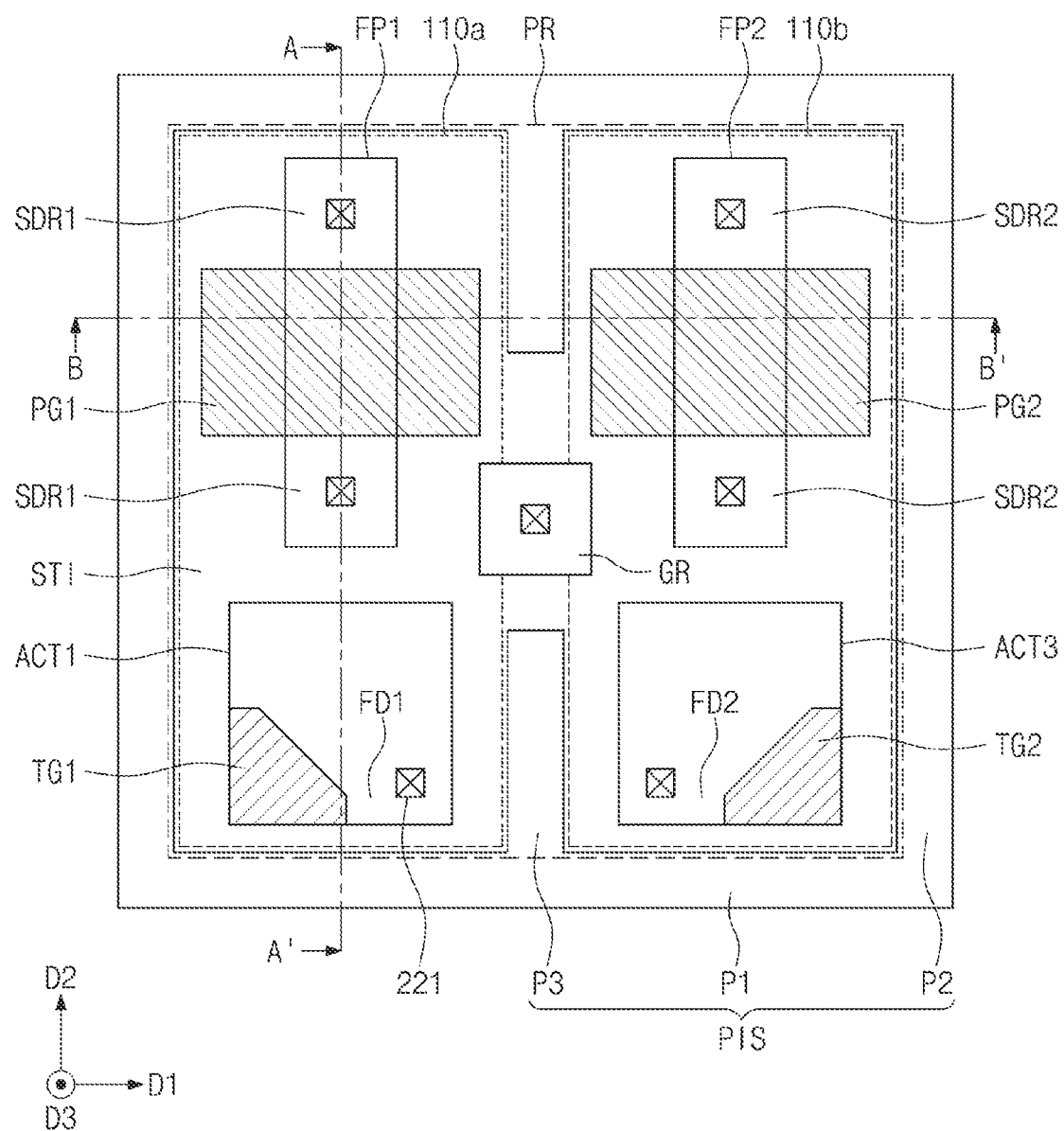
FIG. 7 illustrates a plan view showing a unit pixel of an image sensor according to an embodiment of the present inventive concept.
Figure 8A:
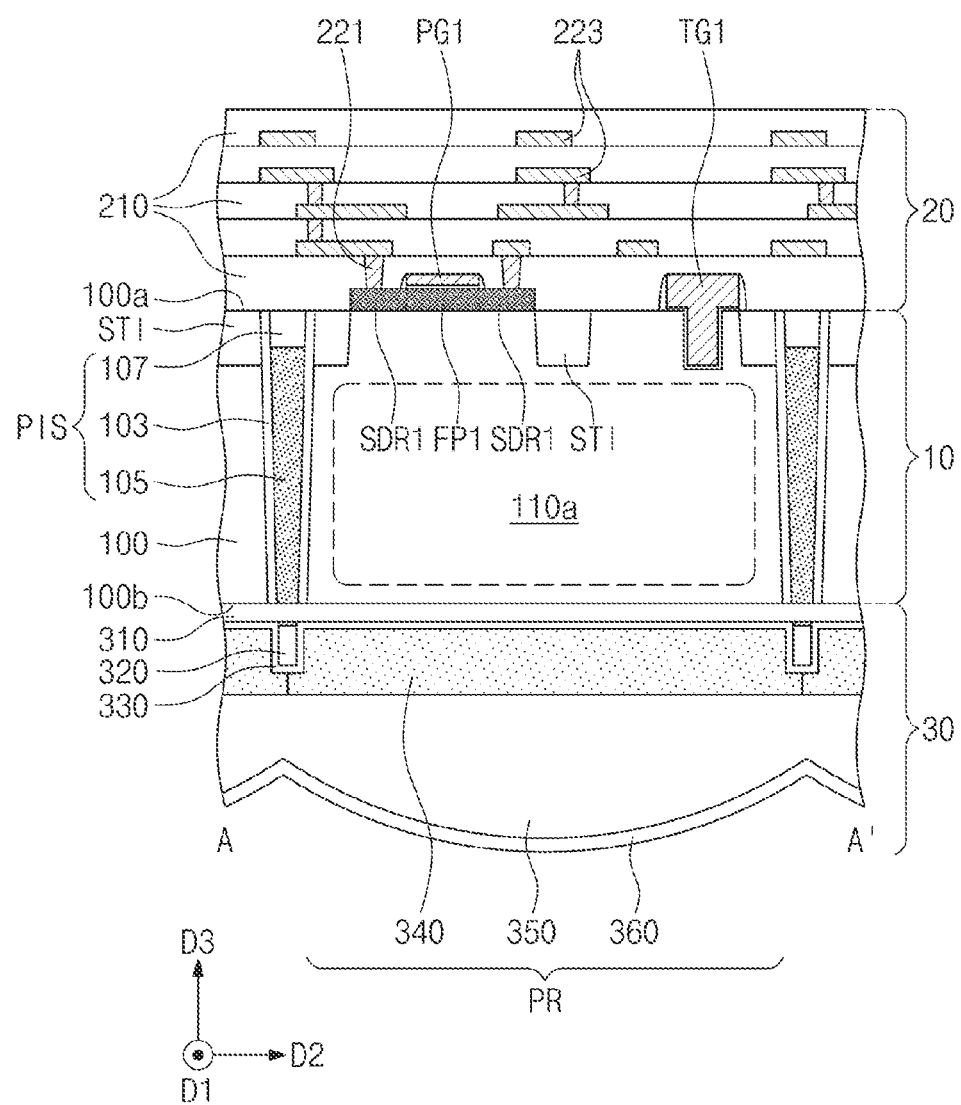
FIGS. 8A and 8B illustrate cross-sectional views respectively taken along lines A-A' and B-B' of FIG. 7, showing an image sensor according to some embodiments of the present inventive concept.
Figure 8B:
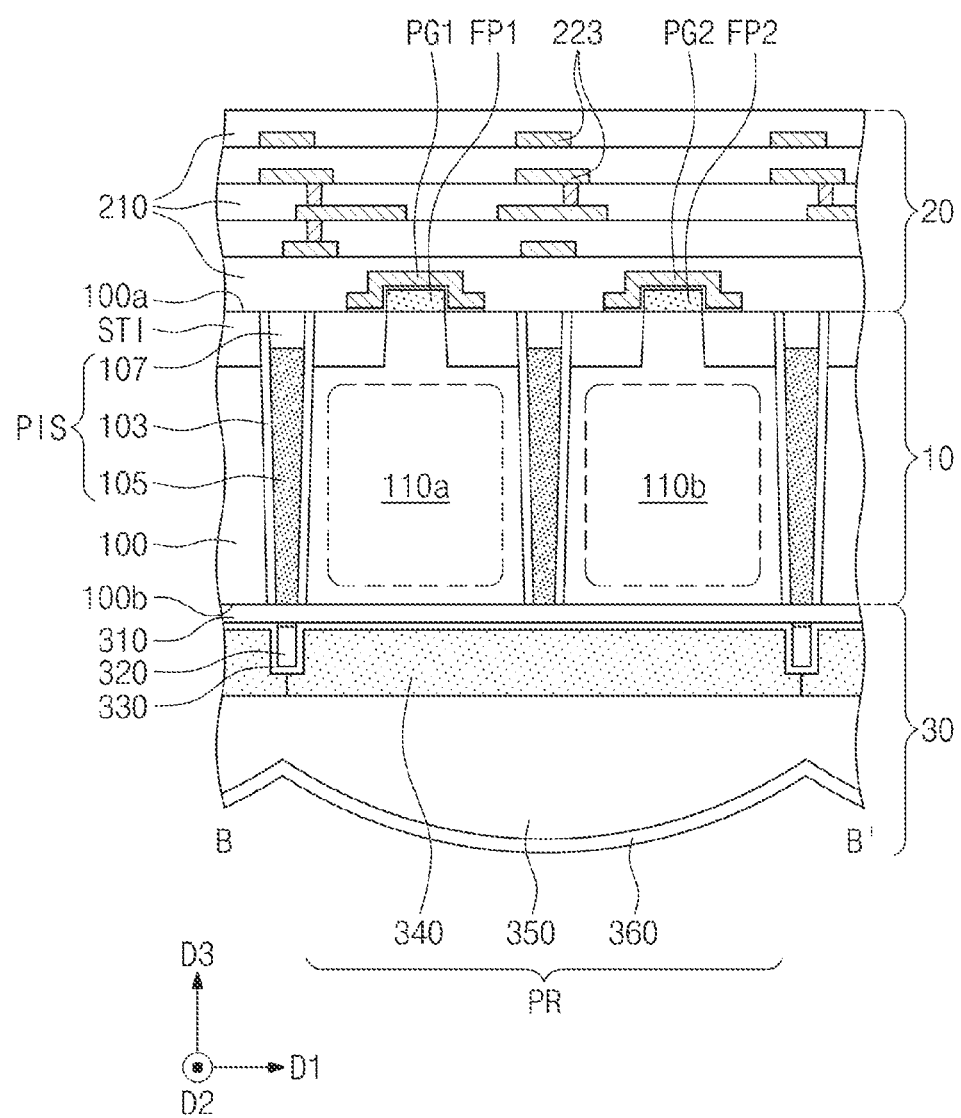

FIG. 7 illustrates a plan view showing a unit pixel of an image sensor according to an embodiment of the present inventive concept. FIGS. 8A and 8B illustrate cross-sectional views respectively taken along lines A-A' and B-B' of FIG. 7, showing an image sensor according to an embodiment of the present inventive concept.

According to some embodiments, a fin-type transistor (e.g., FinFET) including a fin-type channel may be used as each of the pixel transistors, or the reset transistor RX, the source follower transistor SF, the dual conversion gain transistor DCX, and the selection transistor SX that are discussed above with reference to FIGS. 1A and 1B.

For example, referring to FIGS. 7, 8A, and 8B, the semiconductor substrate 100 may include the pixel region PR defined by the pixel separation structure PIS, and on each pixel region PR, the first and second photoelectric conversion regions 110a and 110b may be provided in the semiconductor substrate 100.

The device isolation layer STI may be provided adjacent to the first surface 100a of the semiconductor substrate 100 on each pixel region PR, and may define first and third active portions ACT1 and ACT3 that are spaced apart from each other in the first direction D1.

First and second fin active patterns FP1 and FP2 may be located on the first surface 100a of the semiconductor substrate 100, and may overlap the first and second photoelectric conversion regions 110a and 110b, respectively. The first and second fin active patterns FP1 and FP2 may each have a bar shape and a major axis in the second direction D2. The first fin active pattern FP1 may be spaced apart in the second direction D2 from the first active portion ACT1, and the second fin active pattern FP2 may be spaced apart in the second direction D2 from the third active portion ACT3.

The first and second fin active patterns FP1 and FP2 may include a semiconductor material, such as silicon, germanium, or silicon-germanium. The first and second fin active patterns FP1 and FP2 may be epitaxial layers grown from the semiconductor substrate 100. Alternatively, the first and second fin active patterns FP1 and FP2 may be portions of the semiconductor substrate 100 that are formed by patterning the semiconductor substrate 100.

The first fin active pattern FP1 may include first impurity regions SDR1 that are spaced apart from each other in the second direction D2 and a first channel region between the first impurity regions SDR1. The first pixel gate electrode PG1 may be disposed to extend in the first direction D1 across the first channel region of the first fin active pattern FP1.

The second fin active pattern FP2 may include second impurity regions SDR2 that are spaced apart from each other in the second direction D2 and a second channel region between the second impurity regions SDR2. The second pixel gate electrode PG2 may be disposed to extend in the first direction D1 across the second channel region of the second fin active pattern FP2.

The first pixel gate electrode PG1 may surround opposite sidewalls and a top surface of the first fin active pattern FP1, and the second pixel gate electrode PG2 may surround opposite sidewalls and a top surface of the second fin active pattern FP2. A gate dielectric layer may be interposed between each of the first and second pixel gate electrodes PG1 and PG2 and each of the first and second fin active patterns FP1 and FP2.

Since the first and second fin active patterns FP1 and FP2 are provided as discussed above, the pixel transistors may securely obtain their effective channel widths in the first direction D1 and their effective channel lengths in the second direction D2. Therefore, even though the pixel region PR has a reduced area, it may be possible to optimize electrical characteristics of the pixel transistors.

Figure 9:
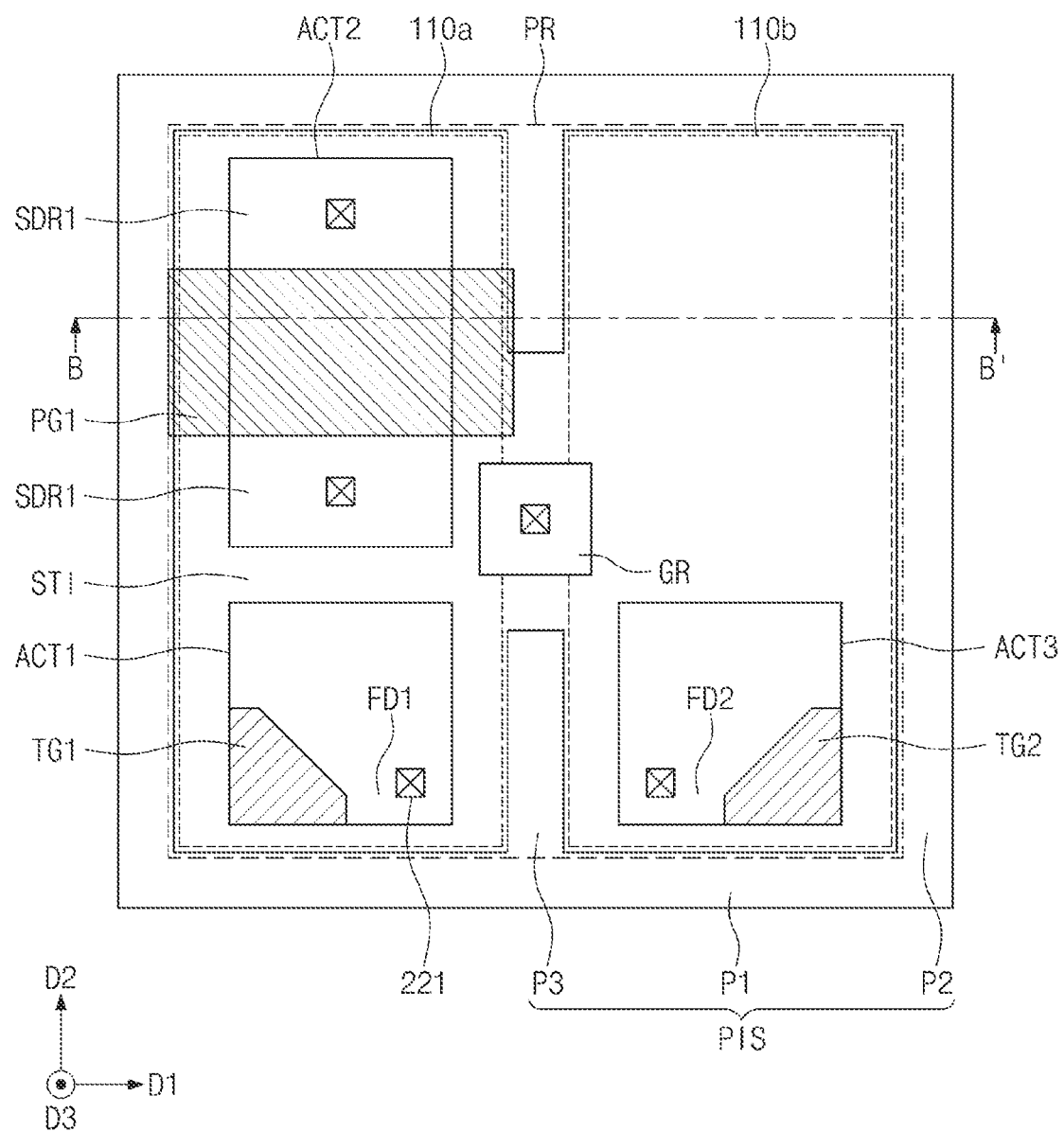
FIG. 9 illustrates a plan view showing a unit pixel of an image sensor according to an embodiment of the present inventive concept.
Figure 10:
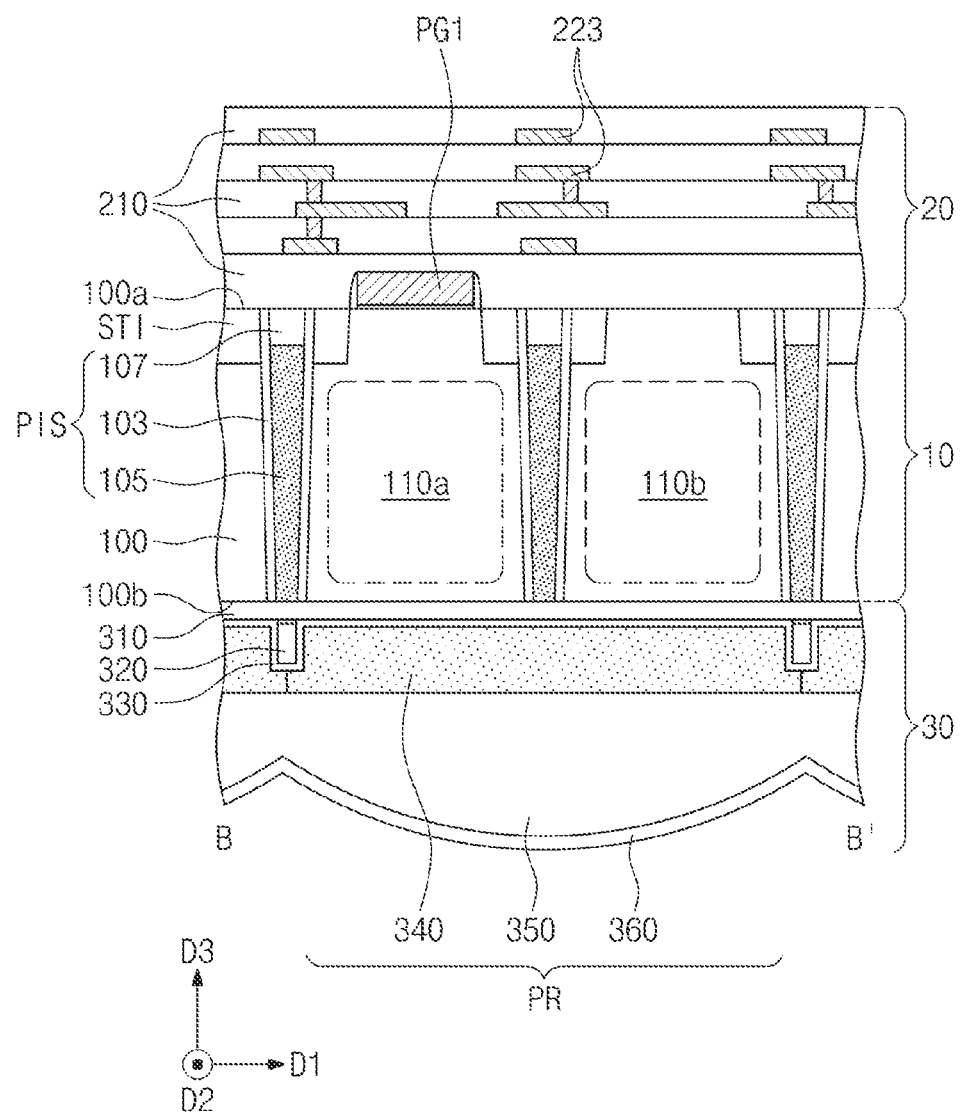
FIG. 10 illustrates a cross-sectional view taken along line B-B' of FIG. 9, showing an image sensor according to an embodiment of the present inventive concept.

FIG. 9 illustrates a plan view showing a unit pixel of an image sensor according to an embodiments of the present inventive concept. FIG. 10 illustrates a cross-sectional view taken along line B-B' of FIG. 9, showing an image sensor according to an embodiment of the present inventive concept.

Referring to FIGS. 9 and 10, the first and second photoelectric conversion regions 110a and 110b may be provided on each pixel region PR, and the pixel transistor may be provided on the first photoelectric conversion region 110a or the second photoelectric conversion region 110b. For example, the second active portion ACT2 and the first pixel gate electrode PG1 that extends across the second active portion ACT2 may overlap one of the first and second photoelectric conversion regions 110a and 110b.

Figure 11:
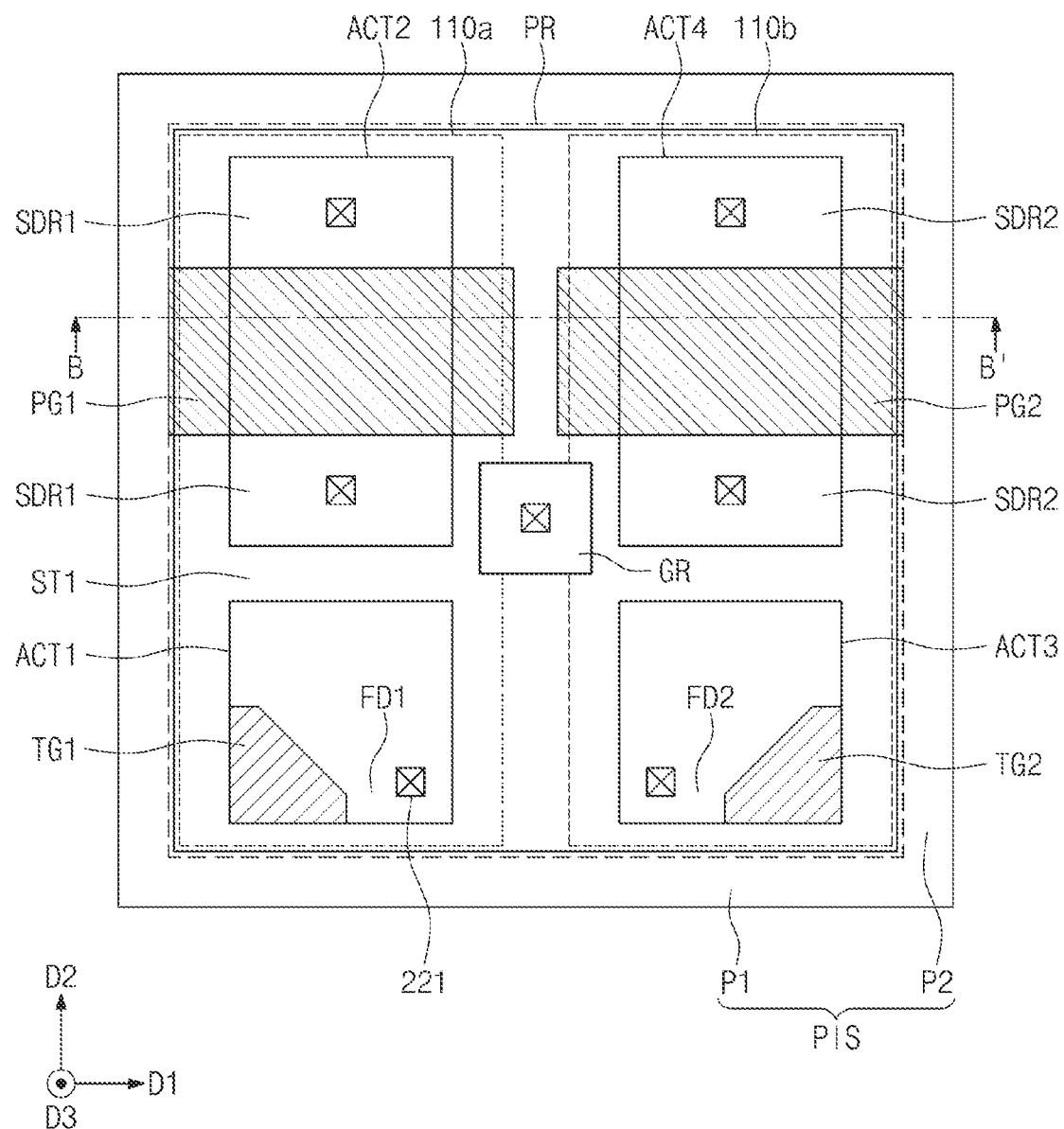
FIG. 11 illustrates a plan view showing a unit pixel of an image sensor according to an embodiment of the present inventive concept.
Figure 12A:
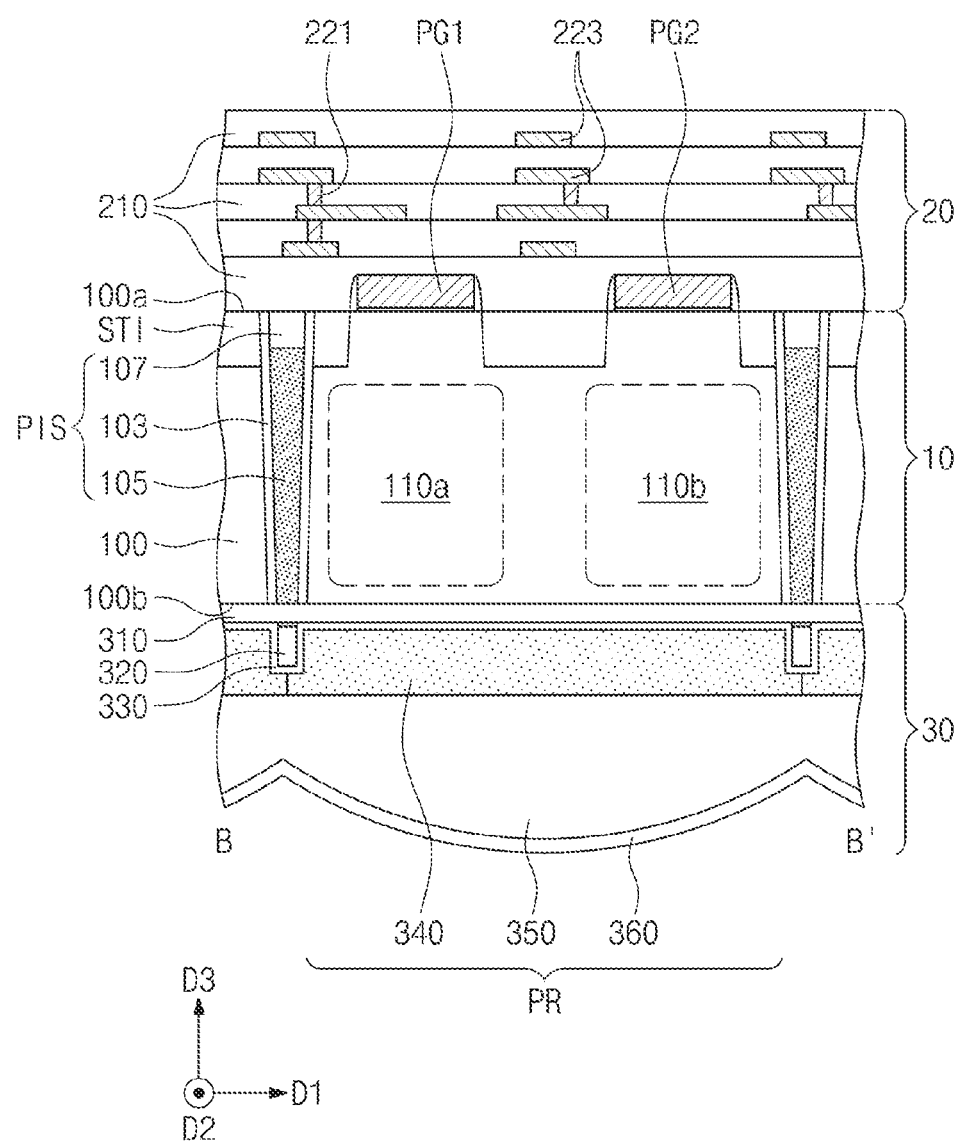
FIGS. 12A and 12B illustrate cross-sectional views taken along line B-B' of FIG. 11, showing an image sensor according to some embodiments of the present inventive concept.
Figure 12B:
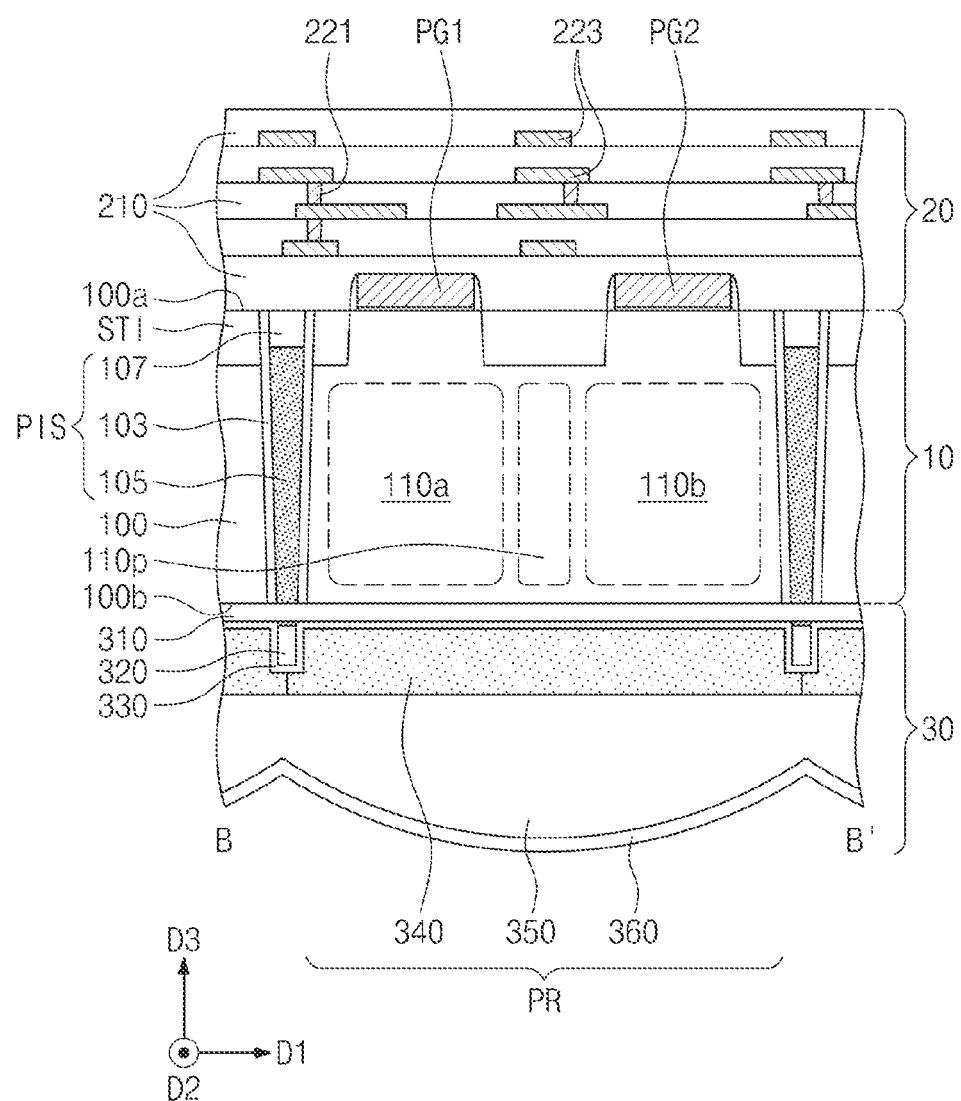

FIG. 11 illustrates a plan view showing a unit pixel of an image sensor according to an embodiment of the present inventive concept. FIGS. 12A and 12B illustrate cross-sectional views taken along line B-B' of FIG. 11, showing an image sensor according to an embodiment of the present inventive concept.

Referring to FIGS. 11 and 12A, the pixel separation structure PIS that defines the pixel region PR may include first portions P1 that extend in the first direction D1 and second portions P2 that extend in the second direction D2 and cross the first portions P1. In an embodiment, the pixel separation structure PIS does not include any protruding portions. For example, as shown in FIG. 12A, on each pixel region PR, a portion of the semiconductor substrate 100 may be present between the first and second photoelectric conversion regions 110a and 110b. Alternatively, referring to FIG. 12B, a separation impurity region 110p may be provided between the first and second photoelectric conversion regions 110a and 110b. The separation impurity region 110p may be formed by ion-implanting the semiconductor substrate 100 with impurities having the same conductivity type (e.g., p-type) as that of the semiconductor substrate 100. The separation impurity region 110p may use a potential barrier to split incident light into two or more beams provided to the first and second photoelectric conversion regions 110a and 110b.

Figure 13:
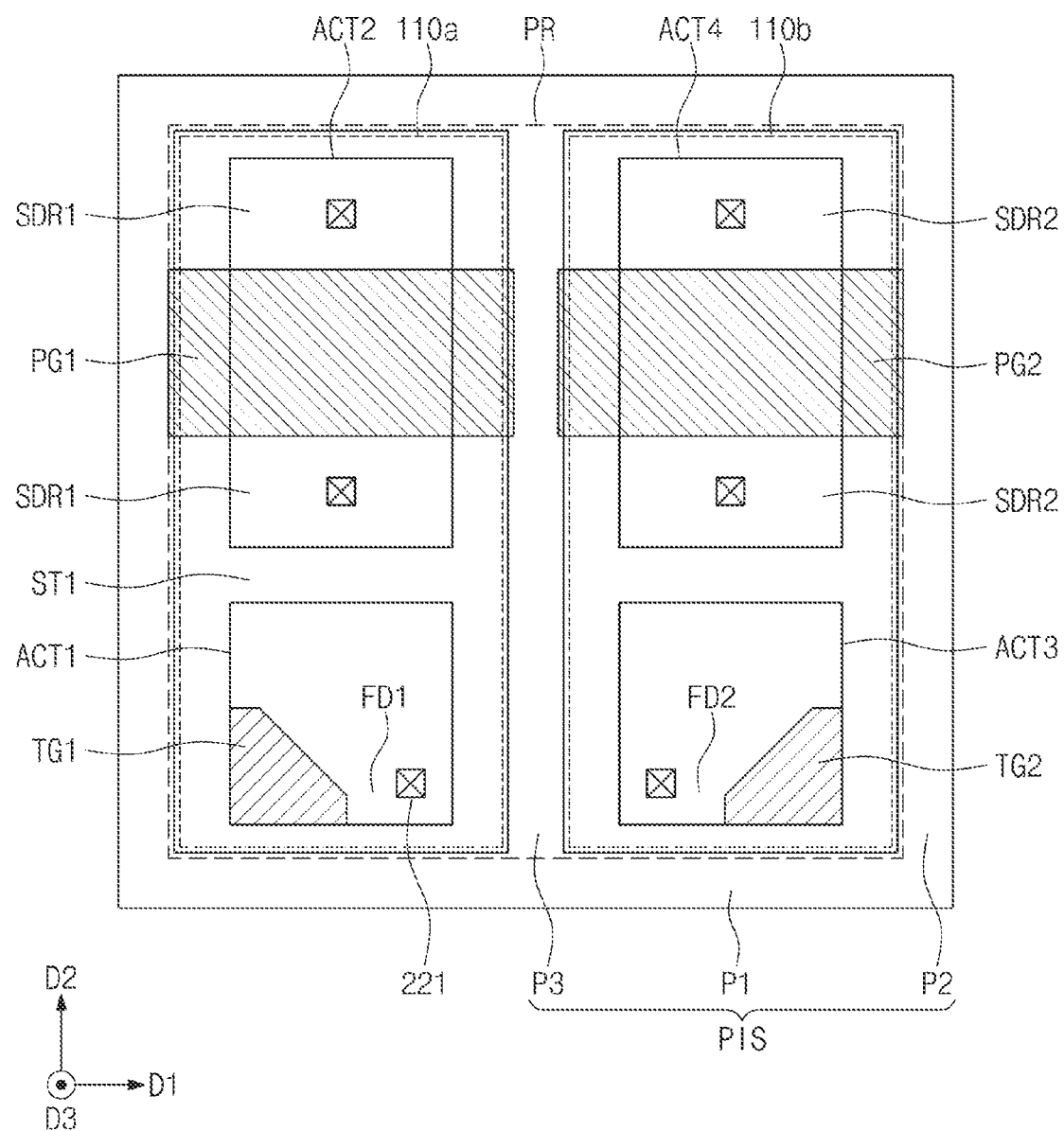
FIG. 13 illustrates a plan view showing a unit pixel of an image sensor according to an embodiment of the present inventive concept.

FIG. 13 illustrates a plan view showing a unit pixel of an image sensor according to an embodiment of the present inventive concept.

According to the embodiment shown in FIG. 13, the pixel separation structure PIS that defines the pixel region PR may include first portions P1 that extend in the first direction D1, second portions P2 that extend in the second direction D2 and intersect the first portions P1, and a third portion P3 that extends parallel to the second portions P2 and intersects the pixel region PR between the first and second photoelectric conversion regions 110a and 110b. The third part P3 may be connected to the first portions P1. On each pixel region PR, the third part P3 of the pixel separation structure PIS may allow the first and second photoelectric conversion regions 110a and 110b to be completely separated from each other in the first direction D1.

Figure 14:
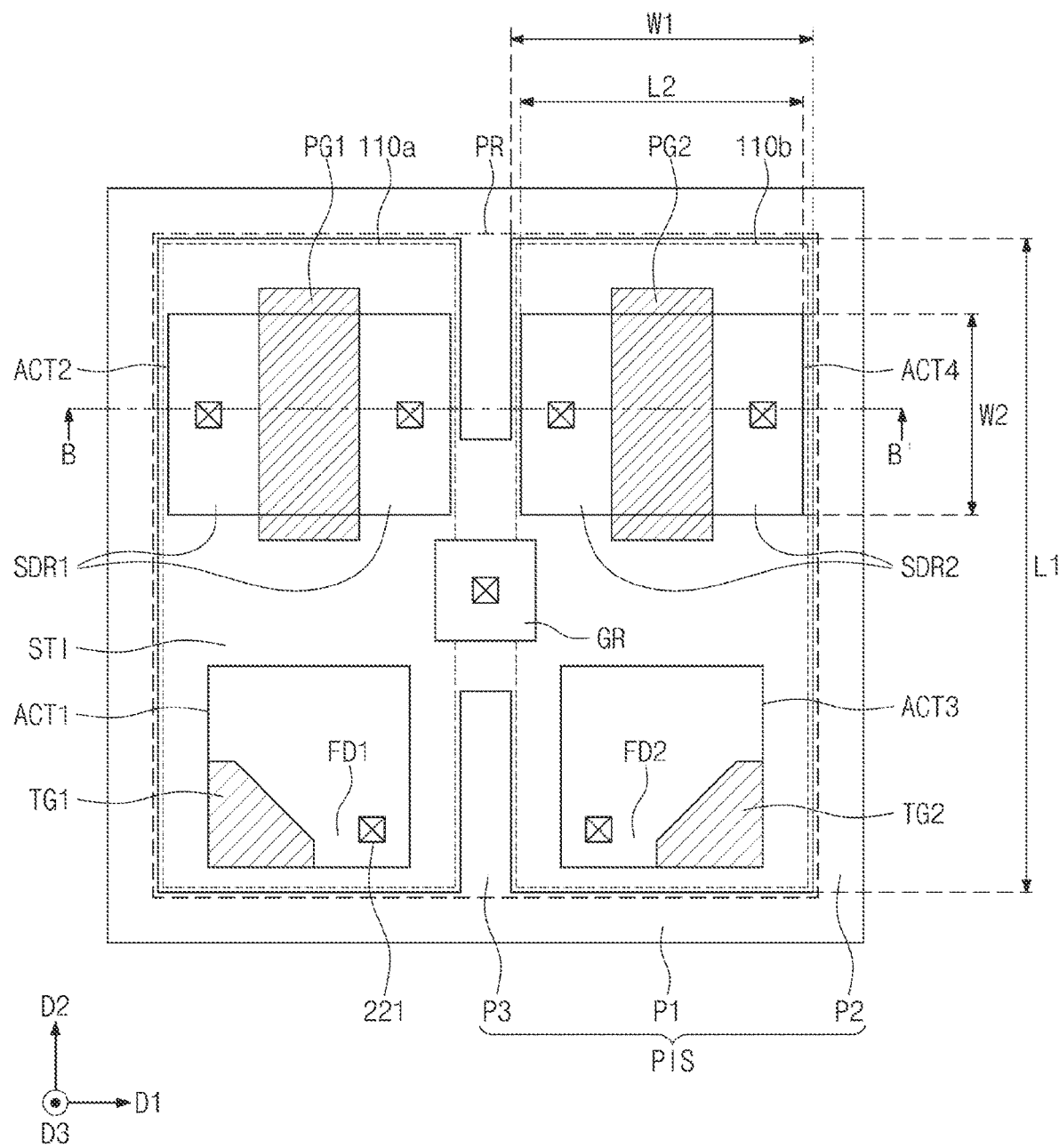
FIG. 14 illustrates a plan view showing a unit pixel of an image sensor according to an embodiment of the present inventive concept.
Figure 15:
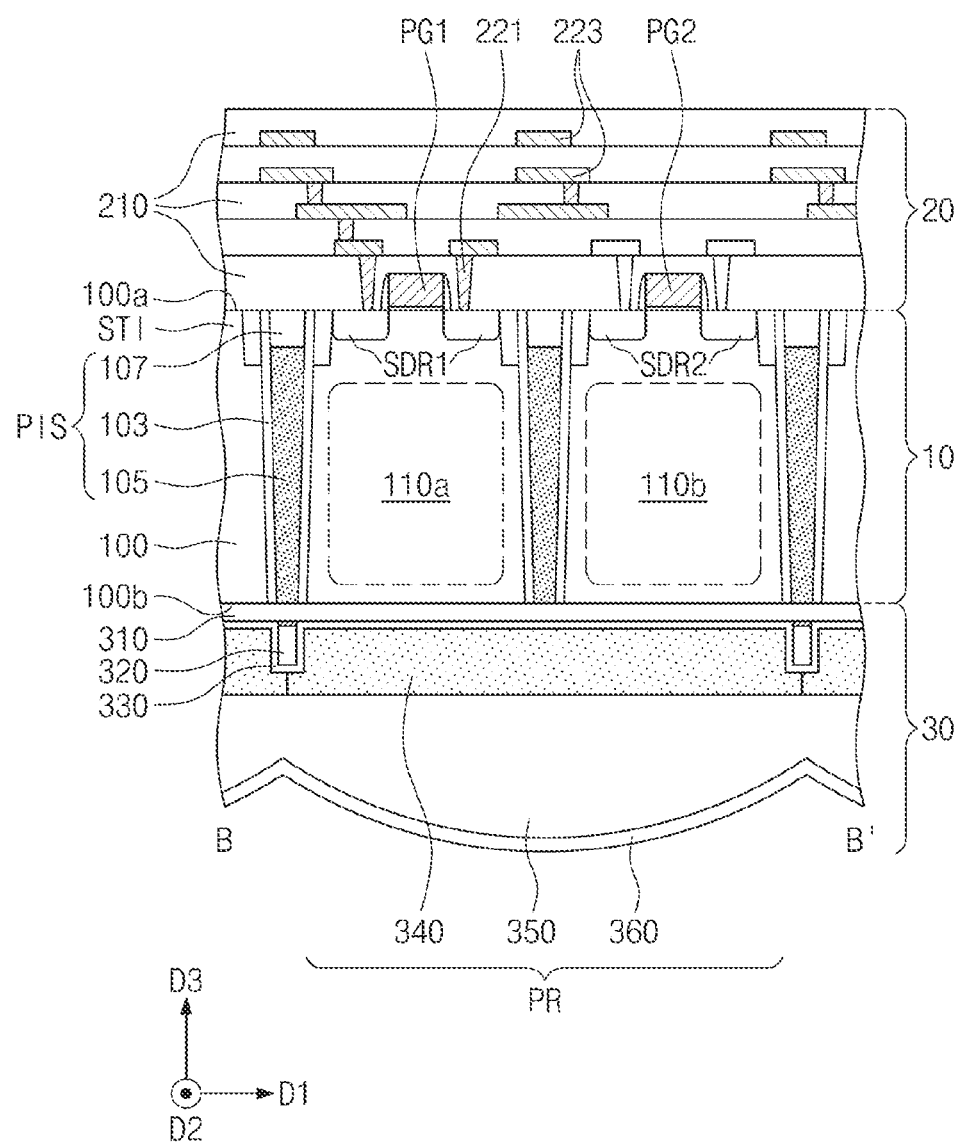
FIG. 15 illustrates a cross-sectional view taken along line B-B' of FIG. 14, showing an image sensor according to some embodiments of the present inventive concepts.

FIG. 14 illustrates a plan view showing a unit pixel of an image sensor according to an embodiment of the present inventive concept. FIG. 15 illustrates a cross-sectional view taken along line B-B' of FIG. 14, showing an image sensor according to an embodiment of the present inventive concept.

Referring to FIGS. 14 and 15, as discussed above, on each pixel region PR, the device isolation layer STI may define first, second, third, and fourth active portions ACT1, ACT2, ACT3, and ACT4. The first and second active portions ACT1 and ACT2 may overlap the first photoelectric conversion region 110a, and the third and fourth active portions ACT3 and ACT4 may overlap the second photoelectric conversion region 110b.

According to an embodiment, each of the second and fourth active portions ACT2 and ACT4 may have a major axis in the first direction D1 and a minor axis in the second direction D2. For example, each of the second and fourth active portions ACT2 and ACT4 may have a second length L2 in the first direction D1 less than a first width W1 of either the first photoelectric conversion region 110a or the second photoelectric conversion region 110b, and may also have a second width W2 in the second direction D2 less than the second length L2.

The first impurity regions SDR1 may be provided spaced apart from each other in the first direction D1 in the second active portion ACT2. The first pixel gate electrode PG1 may extend in the second direction D2 and cross the second active portion ACT2 between the first impurity regions SDR1.

The second impurity regions SDR2 may be provided spaced apart from each other in the first direction D1 in the fourth active portion ACT4. The second pixel gate electrode PG2 may extend in the second direction D2 and cross the fourth active portion ACT4 between the second impurity regions SDR2.

Figure 16:
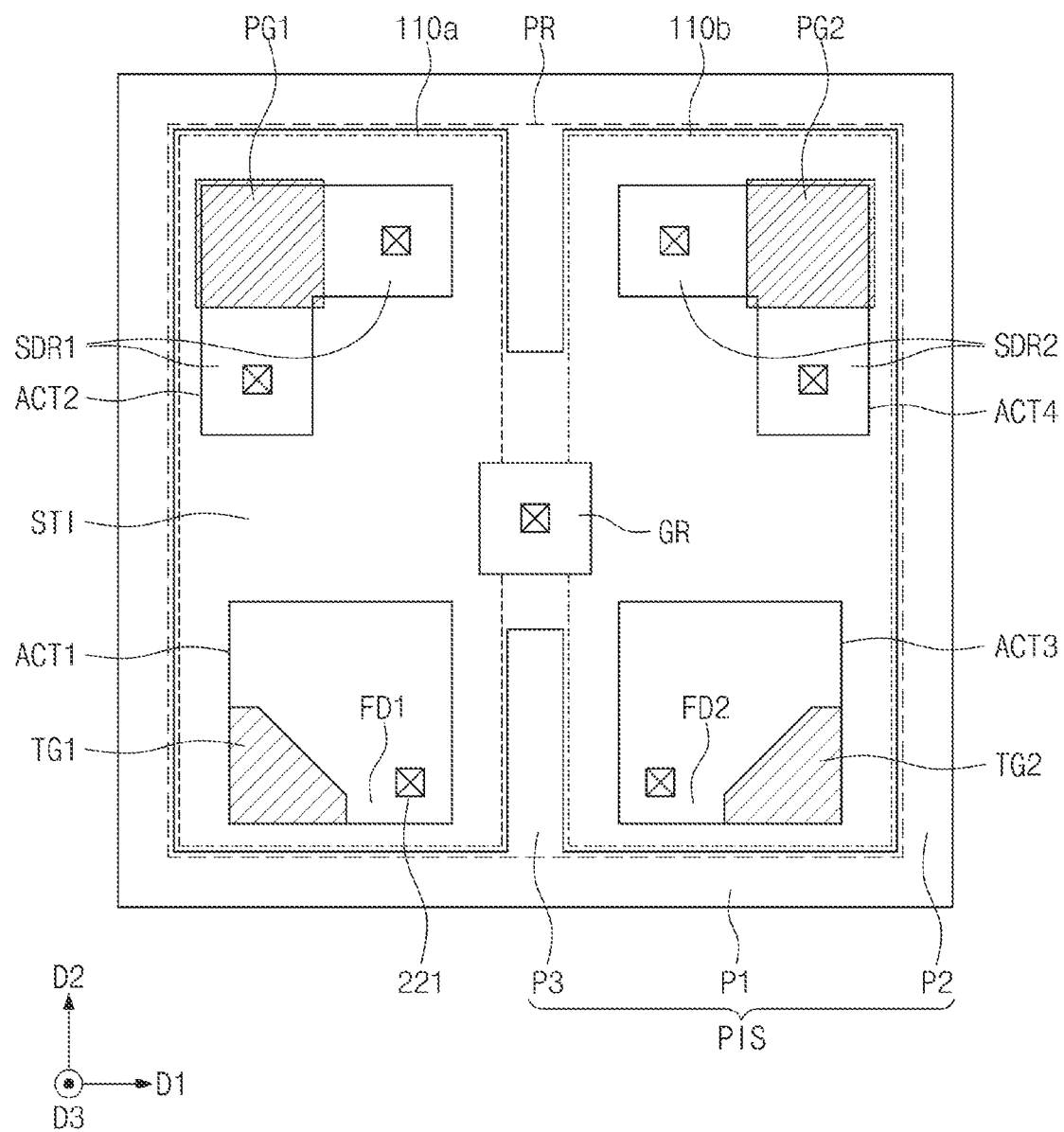
FIG. 16 illustrates a plan view showing a unit pixel of an image sensor according to an embodiment of the present inventive concept.

FIG. 16 illustrates a plan view showing a unit pixel of an image sensor according to an embodiment of the present inventive concept.

According to the embodiment shown in FIG. 16, as discussed above, on each pixel region PR, the device isolation layer STI may define first, second, third, and fourth active portions ACT1, ACT2, ACT3, and ACT4, and the second and fourth active portions ACT2 and ACT4 may each have a polygonal shape.

For example, each of the second and fourth active portions ACT2 and ACT4 may include a first part that extends in the first direction D1, and may also include a second part that intersects the first part and extends in the second direction D2. The second and fourth active portions ACT2 and ACT4 may respectively overlap the first and second photoelectric conversion regions 110a and 110b. For example, the second and fourth active portions ACT2 and ACT4 may be disposed mirror-symmetrically with each other.

The first pixel gate electrode PG1 may be located between the first and second portions of the second active portion ACT2. One of the first impurity regions SDR1 may be located adjacent in the first direction D1 to the first pixel gate electrode PG1, and another of the first impurity regions SDR1 may be located adjacent in the second direction D2 to the first pixel gate electrode PG1.

Likewise, the second pixel gate electrode PG2 may be located between the first and second portions of the fourth active portion ACT4. One of the second impurity regions SDR2 may be located adjacent in the first direction D1 to the second pixel gate electrode PG2, and another of the second impurity regions SDR2 may be located adjacent in the second direction D2 to the second pixel gate electrode PG2.

FIGS. 17 to 24 illustrate enlarged plan views partially showing a pixel array of an image sensor according to some embodiments of the present inventive concept. The same technical features as those of the embodiments discussed above with reference to FIGS. 2 to 16 may be omitted in the interest of brevity of description.

Figure 17:
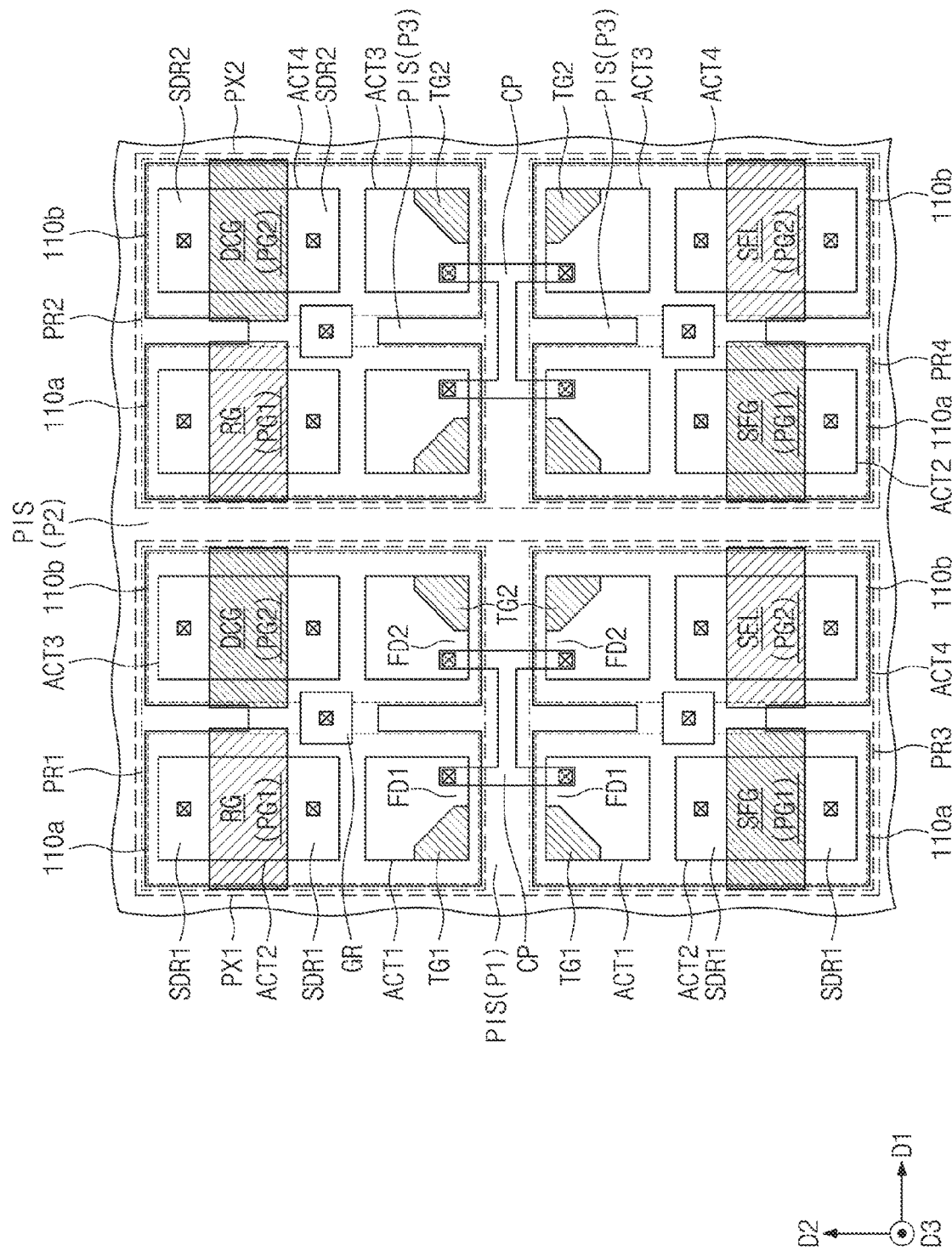
FIGS. 17 to 24 illustrate enlarged plan views partially showing a pixel array of an image sensor according to some embodiments of the present inventive concept.

According to the embodiment shown in FIG. 17, the semiconductor substrate 100 may include a plurality of pixel regions PR that are defined by the pixel separation structure PIS. The plurality of pixel regions PR may be arranged in a matrix shape along first and second directions D1 and D2 that intersect each other.

For example, the plurality of pixel regions PR may include first, second, third, and fourth pixel regions PR1, PR2, PR3, and PR4. The first and second pixel regions PR1 and PR2 may be adjacent to each other in the first direction D1, and the first and third pixel regions PR1 and PR3 may be adjacent to each other in the second direction D2. The second and fourth pixel regions PR2 and PR4 may be adjacent to each other in the second direction D2, and the second and third pixel regions PR2 and PR3 may be adjacent to each other in a diagonal direction.

When viewed in a plan view, each of the first, second, third, and fourth pixel regions PR1, PR2, PR3, and PR4 may be surrounded by the pixel separation structure PIS. Each of the first, second, third, and fourth pixel regions PR1, PR2, PR3, and PR4 may be defined by a pair of first portions P1 that extend in the first direction D1 and a pair of second portions P2 that extend in the second direction D2. In addition, the pixel separation structure PIS may include a pair of third portions P3 on each of the first, second, third, and fourth pixel regions PR1, PR2, PR3, and PR4. The third portions P3 may protrude in the second direction D2 from the first portions P1.

According to some embodiments, as discussed above with reference to FIGS. 2 and 3A to 3C, the first and second photoelectric conversion regions 110a and 110b may be provided to each of the first, second, third, and fourth pixel regions PR1, PR2, PR3, and PR4. On each of the first, second, third, and fourth pixel regions PR1, PR2, PR3, and PR4, the third portions P3 of the pixel separation structure PIS may be located between the first and second photoelectric conversion regions 110a and 110b.

On each of the first, second, third, and fourth pixel regions PR1, PR2, PR3, and PR4, the device isolation layer STI may define the first to fourth active portions ACT1 to ACT4. On each of the first, second, third, and fourth pixel regions PR1, PR2, PR3, and PR4, as discussed above, the first and second active portions ACT1 and ACT2 may overlap the first photoelectric conversion region 110a, the third and fourth active portions ACT3 and ACT4 may overlap the second photoelectric conversion region 110b.

Figure 18:
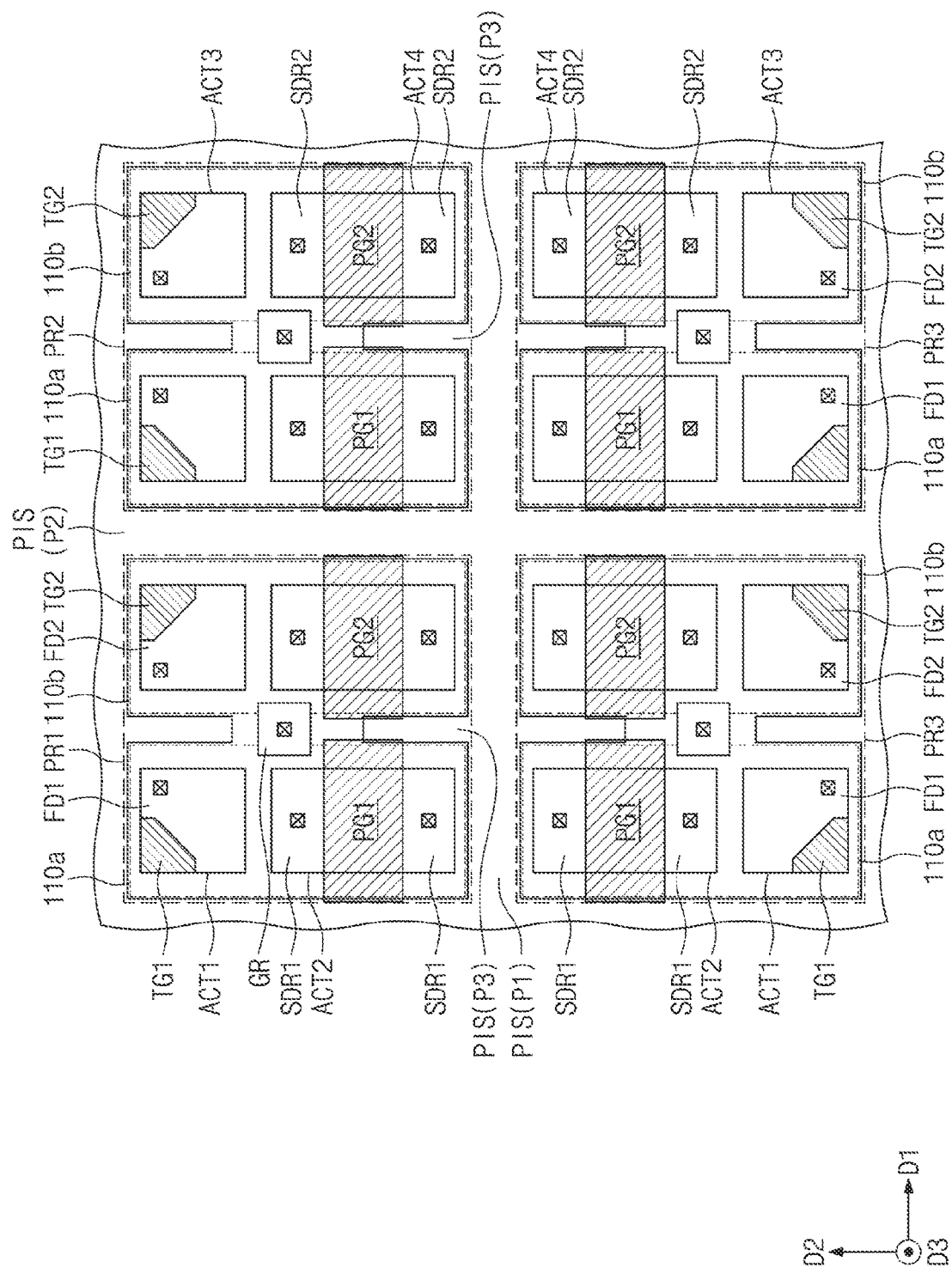

According to the embodiments of FIGS. 17 and 18, the first to fourth active portions ACT1 to ACT4 of the third pixel region PR3 may be located mirror-symmetrically with the first to fourth active portions ACT1 to ACT4 of the first pixel region PR1. The first to fourth active portions ACT1 to ACT4 of the fourth pixel region PR4 may be located mirror-symmetrically with the first to fourth active portions ACT1 to ACT4 of the second pixel region PR2.

For example, referring to FIG. 17, the first and third active portions ACT1 and ACT3 of the first pixel region PR1 may be disposed adjacent in the second direction D2 adjacent to the first and third active portions ACT1 and ACT3 of the third pixel region PR3. In addition, the first and third active portions ACT1 and ACT3 of the second pixel region PR2 may be disposed adjacent in the second direction D2 to the first and third active portions ACT1 and ACT3 of the fourth pixel region PR4.

Alternatively, as illustrated in FIG. 18, the second and fourth active portions ACT2 and ACT4 of the first pixel region PR1 may be disposed adjacent in the second direction D2 to the second and fourth active portions ACT2 and ACT4 of the third pixel region PR3. In addition, the second and fourth active portions ACT2 and ACT4 of the second pixel region PR2 may be disposed adjacent in the second direction D2 to the second and fourth active portions ACT2 and ACT4 of the fourth pixel region PR4.

On each of the first, second, third, and fourth pixel regions PR1, PR2, PR3, and PR4, as discussed above, the first and second transfer gate electrodes TG1 and TG2 may be located respectively on the first and third active portions ACT1 and ACT3.

On each of the first, second, third, and fourth pixel regions PR1, PR2, PR3, and PR4, the first and second pixel gate electrodes PG1 and PG2 may be located respectively on the second and fourth active portions ACT2 and ACT4. The first impurity regions SDR1 may be spaced apart from each other in the second direction D2 and located in the second active portion ACT2, and the second impurity regions SDR2 may be spaced apart from each other in the second direction D2 and located in the fourth active portion ACT4.

According to the embodiment shown in FIG. 17, the first and third pixel regions PR1 and PR3 may constitute a first pixel group PX1, and the second and fourth pixel regions PR2 and PR4 may constitute a second pixel group PX2.

Each of the first and second pixel gate electrodes PG1 and PG2 on each of the first and third pixel regions PR1 and PR3 may constitute one of the reset gate electrode RG, the dual conversion gain gate electrode DCG, the source follower gate electrode SFG, and the selection gate electrode SEL that are discussed with reference to FIG. 1A or 1B. Likewise, each of the first and second pixel gate electrodes PG1 and PG2 on each of the second and fourth pixel regions PR2 and PR4 may constitute one of the reset gate electrode RG, the dual conversion gain gate electrode DCG, the source follower gate electrode SFG, and the selection gate electrode SEL that are discussed with reference to FIG. 1A or 1B.

For example, the first pixel gate electrode PG1 of the first pixel region PR1 may be provided as the reset gate electrode RG discussed with reference to FIG. 1A or 1B, and the second pixel gate electrode PG2 of the first pixel region PR1 may be provided as the dual conversion gain gate electrode DCG discussed with reference to FIG. 1A to 1B. The first pixel gate electrode PG1 of the third pixel region PR3 may be provided as the source follower gate electrode SFG discussed with reference to FIG. 1A or 1B, the second pixel gate electrode PG2 of the third pixel region PR3 may be provided as the selection gate electrode SEL discussed with reference to FIG. 1A or 1B. The first and second pixel gate electrodes PG1 and PG2 on each of the first and third pixel regions PR1 and PR3 may have various functions.

The first and second floating diffusion regions FD1 and FD2 of the first and third pixel regions PR1 and PR3 may be electrically connected in common through a conductive pattern CP. The first and second photoelectric conversion regions 110a and 110b of the first and third pixel regions PR1 and PR3 may electrically share the reset gate electrode RG, the dual conversion gain gate electrode DCG, the source follower gate electrode SFG, and the selection gate electrode SEL.

Alternatively, one of the first and second pixel gate electrodes PG1 and PG2 of the first and third pixel regions PR1 and PR3 may be provided as a dummy gate electrode of a dummy transistor that is not electrically connected to the first and second photoelectric conversion regions 110a and 110b. For example, either the first pixel region PR1 or the third pixel region PR3 may be provided with a dummy transistor instead of the dual conversion gain transistor DCX discussed with reference to FIG. 1A or 1B.

According to some embodiments, on each of the first and second pixel groups PX1 and PX2, the first and second pixel gate electrodes PG1 and PG2 may have their shapes that are variously changed as shown in FIGS. 3A, 6, 8A, and 8B.

For example, on the first pixel group PX1, the reset gate electrode RG and the selection gate electrode SEL may be shaped like a recessed gate electrode as illustrated in FIG. 6, and the source follower gate electrode SFG may be shaped like a planar gate electrode.

Figure 19:
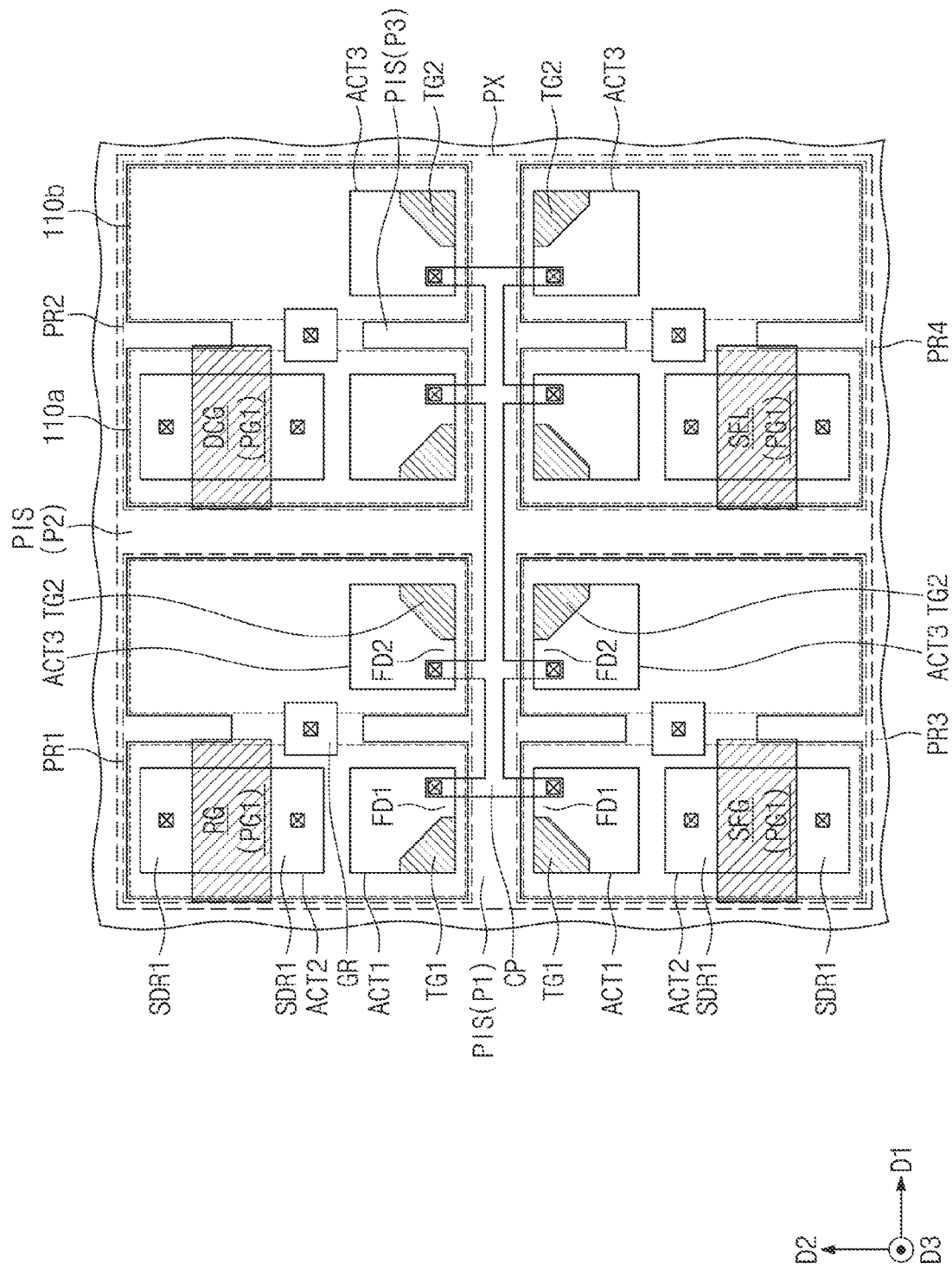

According to the embodiment shown in FIG. 19, the semiconductor substrate 100 may include first, second, third, and fourth pixel regions PR1, PR2, PR3, and PR4 that are defined by the pixel separation structure PIS.

According to the present embodiment, on each of the first, second, third, and fourth pixel regions PR1, PR2, PR3, and PR4, the device isolation layer STI may define first, second, and third active portions ACT1, ACT2, and ACT3. For example, on each of the first, second, third, and fourth pixel regions PR1, PR2, PR3, and PR4, the first and second active portions ACT1 and ACT2 may overlap the first photoelectric conversion region 110a, and the third active portion ACT3 may overlap the second photoelectric conversion region 110b. For example, the fourth active portion ACT4 may be omitted from the present embodiment.

On each of the first, second, third, and fourth pixel regions PR1, PR2, PR3, and PR4, the first and second transfer gate electrodes TG1 and TG2 may be provided on the first and third active portions ACT1 and ACT3, respectively, and the first and second floating diffusion regions FD1 and FD2 may be provided on sides of the first and second transfer gate electrodes TG1 and TG2, respectively.

On each of the first, second, third, and fourth pixel regions PR1, PR2, PR3, and PR4, the first pixel gate electrode PG1 may be provided on the second active portion ACT2. The first impurity regions SDR1 may be provided in the second active portion ACT2 on opposite sides of the first pixel gate electrode PG1. As discussed above, the first impurity regions SDR1 may be spaced apart from each other in the second direction D2 and cross the first pixel gate electrode PG1.

The first, second, third, and fourth pixel regions PR1, PR2, PR3, and PR4 may constitute a single pixel group PX. In this case, each of the first pixel gate electrodes PG1 of the first, second, third, and fourth pixel regions PR1, PR2, PR3, and PR4 may constitute one of the reset gate electrode RG, the source follower gate electrode SFG, the dual conversion gain gate electrode DCG, and the selection gate electrode SEL that are discussed with reference to FIG. 1A or 1B.

The first and second floating diffusion regions FD1 and FD2 of the first, second, third, and fourth pixel regions PR1, PR2, PR3, and PR4 may be electrically connected in common to each other through the conductive pattern CP. The first and second photoelectric conversion regions 110a and 110b of the first, second, third, and fourth pixel regions PR1, PR2, PR3, and PR4 may electrically share the reset gate electrode RG, the dual conversion gain gate electrode DCG, the source follower gate electrode SFG, and the selection gate electrode SEL.

Figure 20:
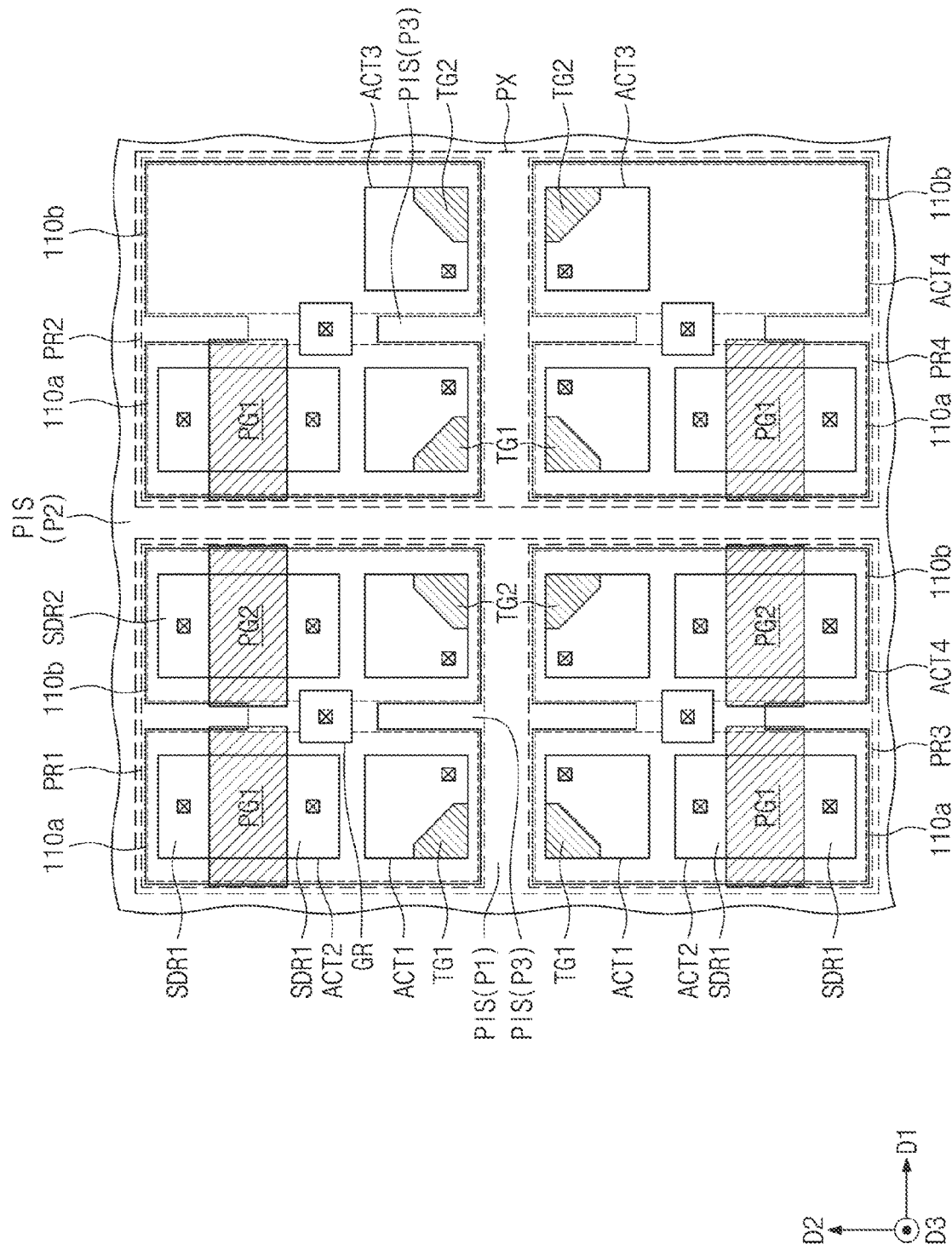

According to the embodiment shown in FIG. 20, on each of the first and third pixel regions PR1 and PR3, the device isolation layer STI may define first to fourth active portions ACT1 to ACT4, and on each of the second and fourth pixel regions PR2 and PR4, the device isolation layer STI may define first to third active portions ACT1 to ACT3.

On the first and third pixel regions PR1 and PR3, the first to fourth active portions ACT1 to ACT4 may be substantially the same as the embodiment discussed with reference to FIG. 17. For example, on each of the first and third pixel regions PR1 and PR3, the first and second active portions ACT1 and ACT2 may overlap the first photoelectric conversion region 110a, and the third and fourth active portions ACT3 and ACT4 may overlap the second photoelectric conversion region 110b.

On the second and fourth pixel regions PR2 and PR4, the first, second, and third active portions ACT1, ACT2, and ACT3 may be substantially the same as the embodiment discussed with reference to FIG. 19. On each of the second and fourth pixel regions PR2 and PR4, the first and second active portions ACT1 and ACT2 may overlap the first photoelectric conversion region 110a, and the third active portion ACT3 may overlap the second photoelectric conversion region 110b.

In some embodiments, each of the first and second pixel regions PR1 and PR2 may include the first to fourth active portions ACT1 to ACT4, and each of the third and fourth pixel regions PR3 and PR4 may include the first to third active portions ACT1 to ACT3.

According to the embodiments shown in FIGS. 21 and 22, as discussed with reference to FIG. 17, the semiconductor substrate 100 may include the first, second, third, and fourth pixel regions PR1, PR2, PR3, and PR4 that are defined by the pixel separation structure PIS.

Figure 21:
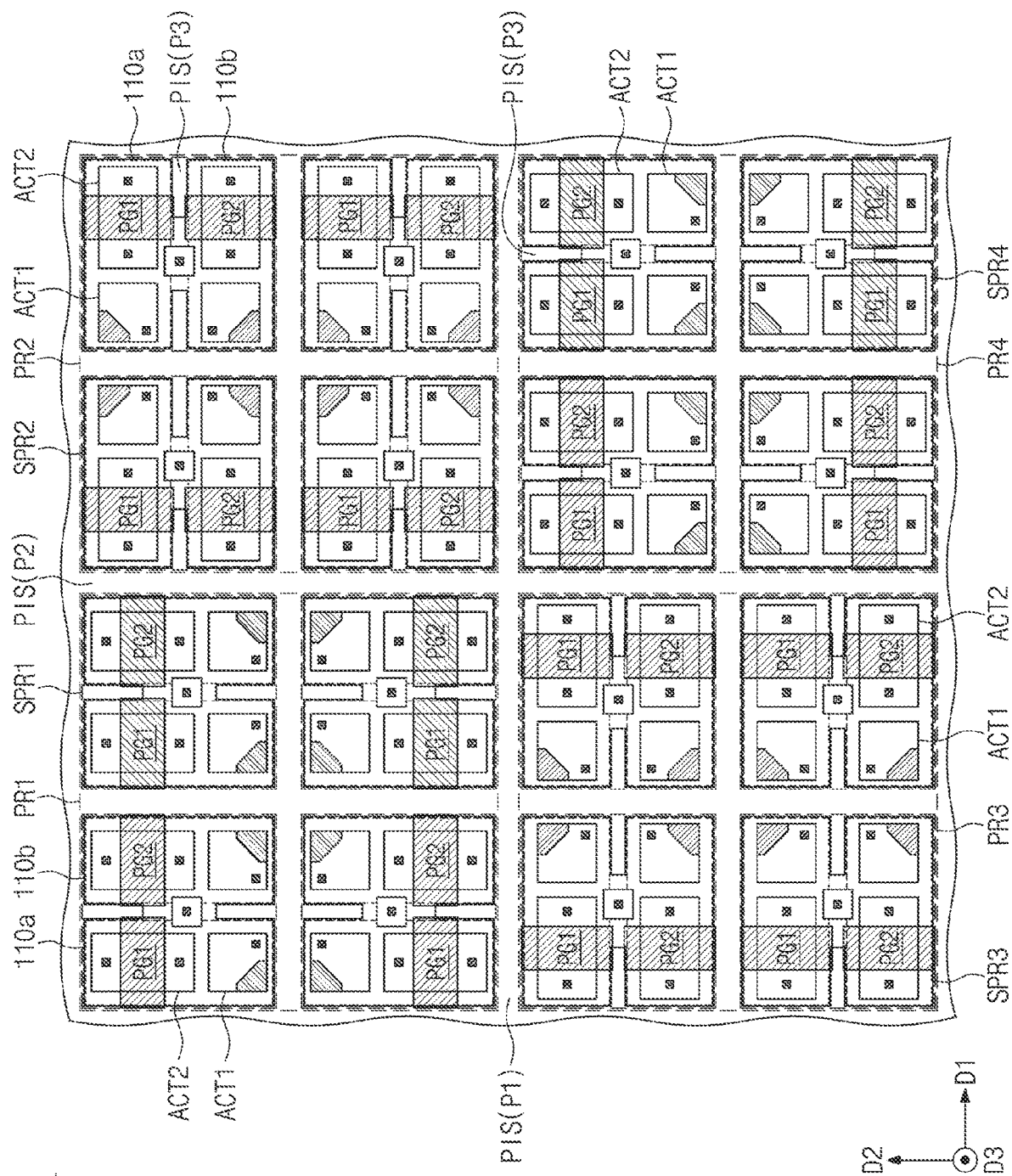

According to the embodiment shown in FIG. 21, a plurality of sub-pixel regions SPR1, SPR2, SPR3, and SPR4 may constitute each of the first, second, third, and fourth pixel regions PR1, PR2, PR3, and PR4. For example, four first sub-pixel regions SPR1 may constitute a single first pixel region PR1. The number of the first sub-pixel regions SPR1 may be changed, and this may hold true for the second, third, and fourth pixel regions PR2, PR3, and PR4.

For example, on each of the first and fourth sub-pixel regions SPR1 and SPR4, the first and second photoelectric conversion regions 110a and 110b may be located spaced apart from each other in the first direction D1, and on each of the second and third sub-pixel regions SPR2 and SPR3, the first and second photoelectric conversion regions 110a and 110b may be located spaced apart from each other in the second direction D2.

The pixel separation structure PIS may include third portions P3 that protrude in the second direction D2 from the first portions P1 on each of the first and fourth sub-pixel regions SPR1 and SPR4, and may include third portions P3 that protrude in the first direction D1 from the second portions P2 on each of the second and third sub-pixel regions SPR2 and SPR3.

On each of the first and fourth sub-pixel regions SPR1 and SPR4, the second and fourth active portions ACT2 and ACT4 may each have a major axis in the second direction D2, and the first and second pixel gate electrodes PG1 and PG2 may extend in the first direction D1 and cross the second and fourth active portions ACT2 and ACT4, respectively.

On each of the second and third sub-pixel regions SPR2 and SPR3, the second and fourth active portions ACT2 and ACT4 may each have a major axis in the first direction D1, and the first and second pixel gate electrodes PG1 and PG2 may extend in the second direction D2 and cross the second and fourth active portions ACT2 and ACT4, respectively.

Figure 22:
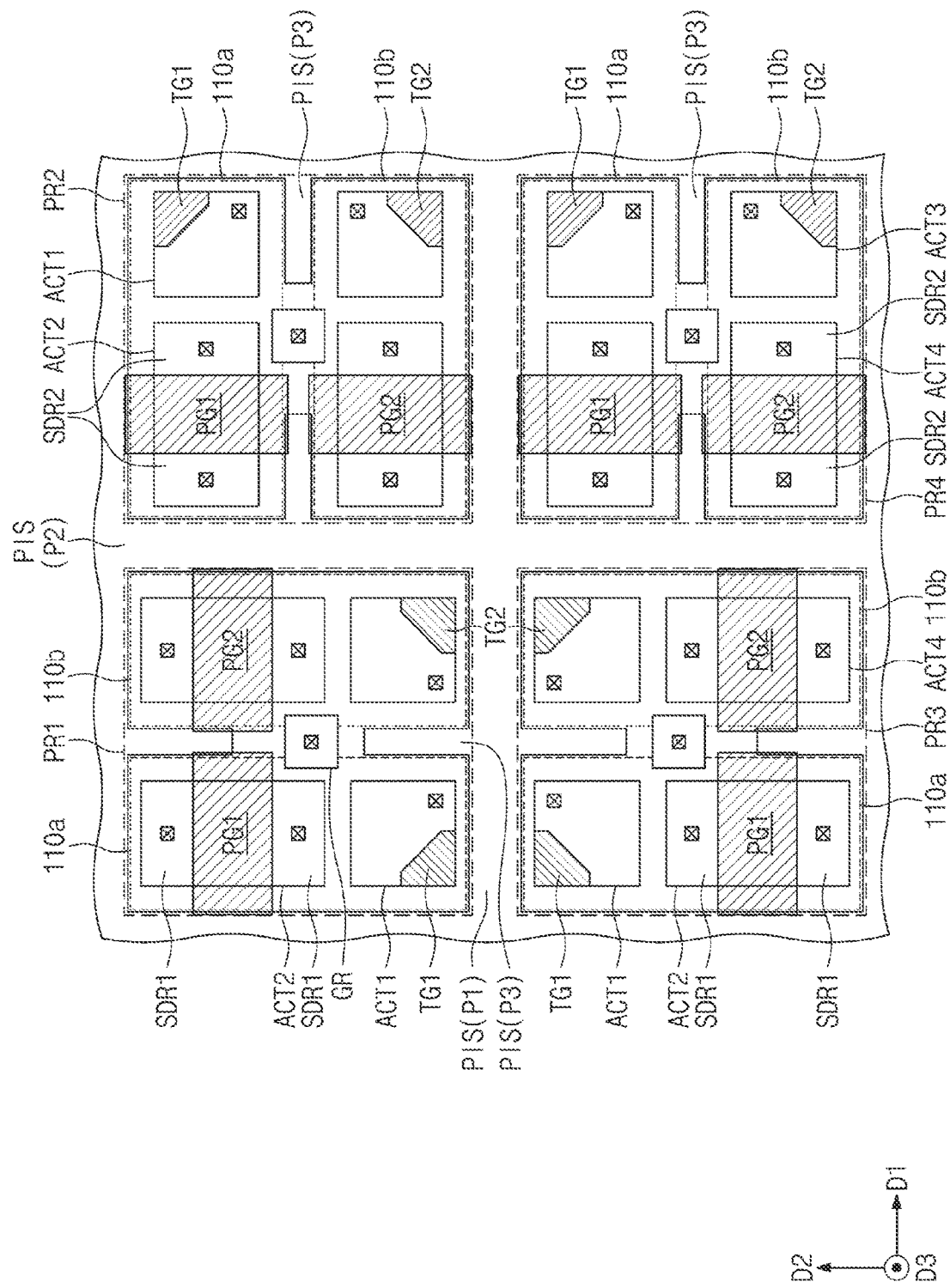

According to the embodiment shown in FIG. 22, on each of the first and third pixel regions PR1 and PR3 that are adjacent to each other in the second direction D2, the first and second photoelectric conversion regions 110a and 110b may be located spaced apart from each other in the first direction D1.

On each of the second and fourth pixel regions PR2 and PR4 that are adjacent to each other in the second direction D2, the first and second photoelectric conversion regions 110a and 110b may be located spaced apart from each other in the second direction D2.

The pixel separation structure PIS may include third portions P3 that protrude in the second direction D2 from the first portions P1 on each of the first and third pixel regions PR1 and PR3, and may include third portions P3 that protrude in the first direction D1 from the second portions P2 on each of the second and fourth pixel regions PR2 and PR4.

On the first and third pixel regions PR1 and PR3, the second and fourth active portions ACT2 and ACT4 may each have a major axis in the second direction D2, and the first and second pixel gate electrodes PG1 and PG2 may extend in the first direction D1 and cross the second and fourth active portions ACT2 and ACT4, respectively.

On each of the second and fourth pixel regions PR2 and PR4, the second and fourth active portions ACT2 and ACT4 may each have a major axis in the first direction D1, and the first and second pixel gate electrodes PG1 and PG2 may extend in the second direction D2 and cross the second and fourth active portions ACT2 and ACT4, respectively.

Figure 23:
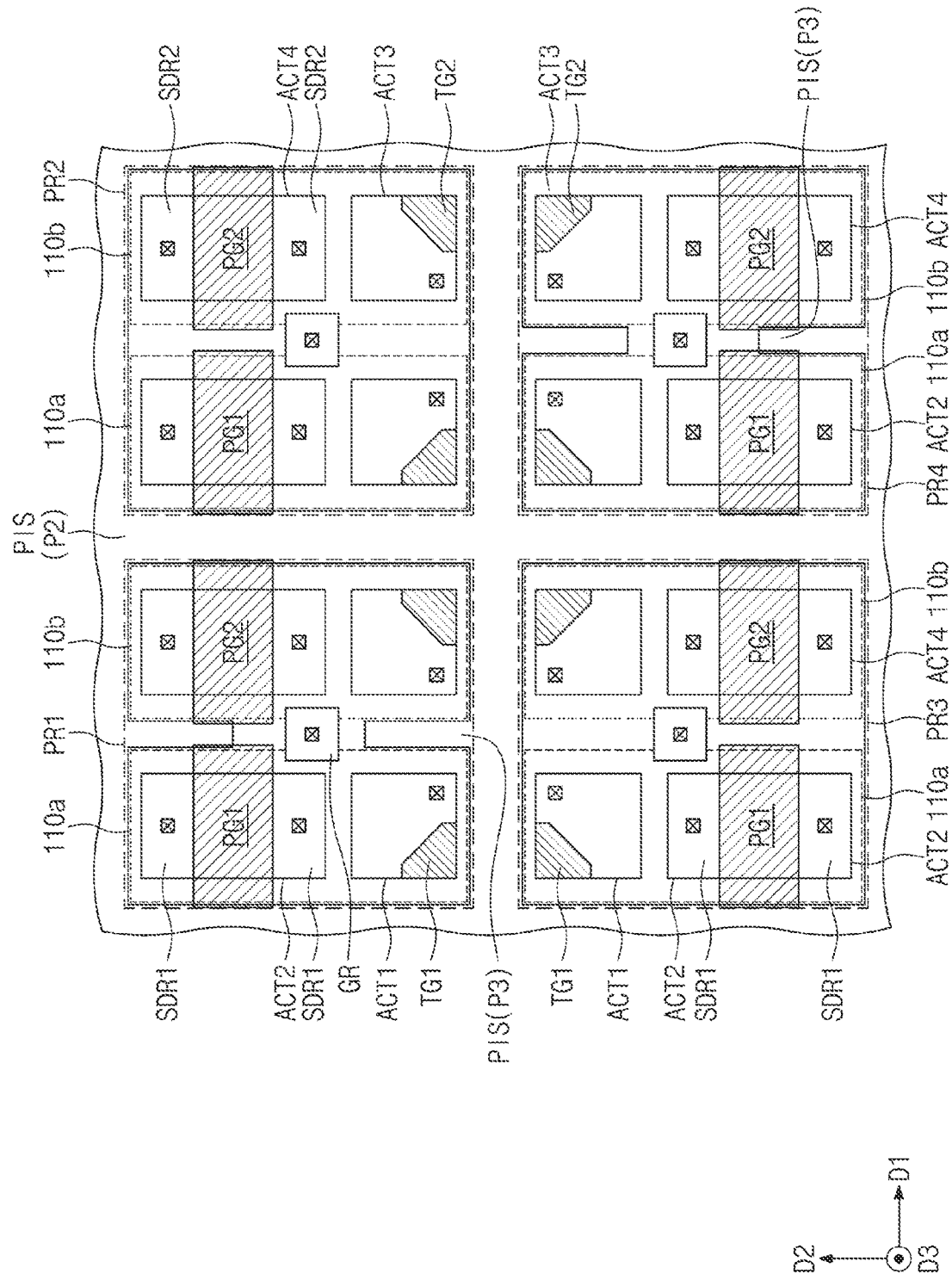

According to the embodiment shown in FIG. 23, on each of the first, second, third, and fourth pixel regions PR1, PR2, PR3, and PR4, the first and second photoelectric conversion regions 110a and 110b may be located spaced apart from each other in the first direction D1.

The pixel separation structure PIS may include third portions P3 that protrude in the second direction D2 from the first portions P1 on each of the first and fourth pixel regions PR1 and PR4, and may be omitted between the first and second photoelectric conversion regions 110a and 110b on each of the second and third pixel regions PR2 and PR3.

Figure 24:
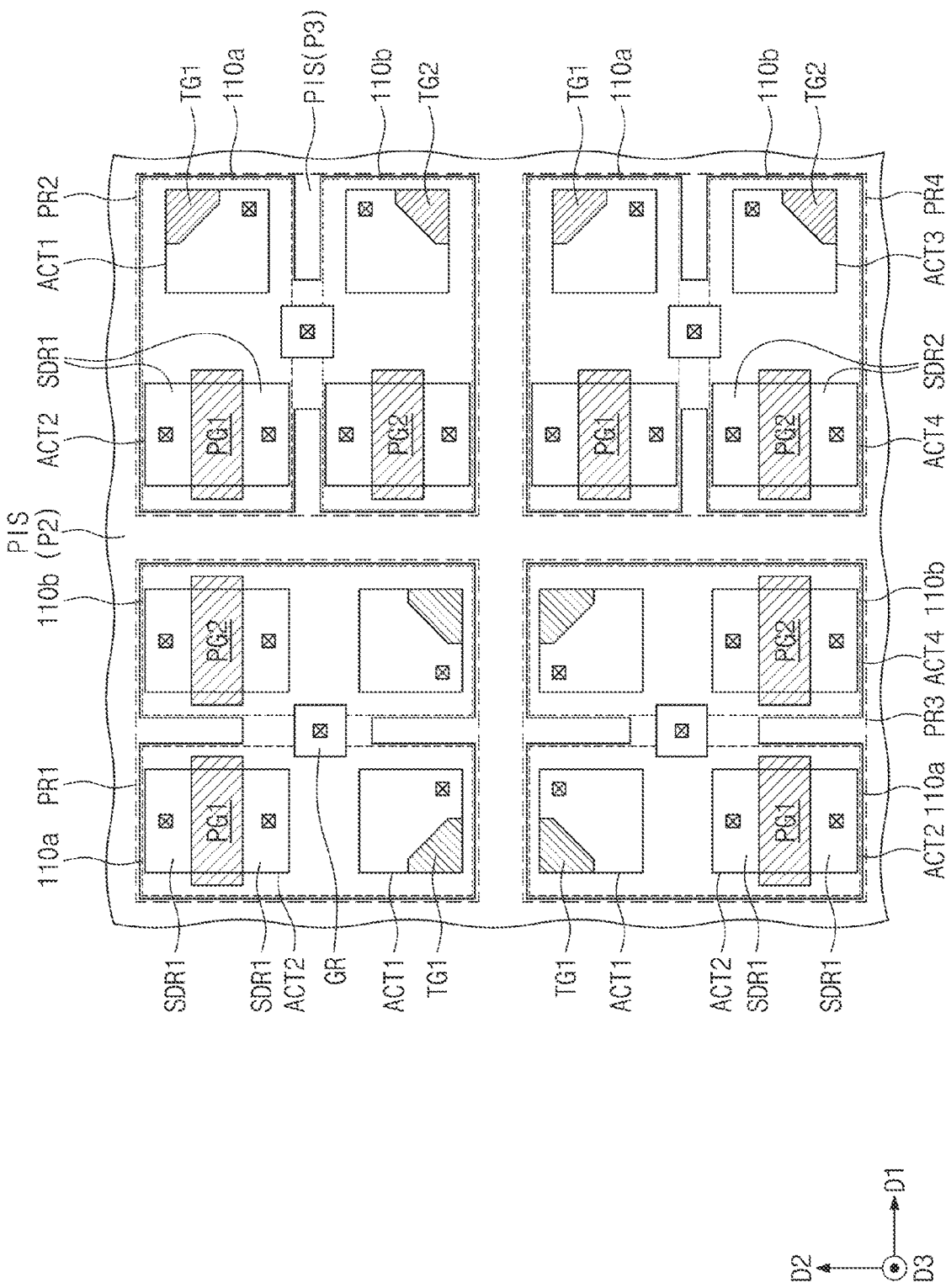

According to the embodiment shown in FIG. 24, on each of the first and third pixel regions PR1 and PR3 that are adjacent to each other in the second direction D2, the first and second photoelectric conversion regions 110a and 110b may be located spaced apart from each other in the first direction D1.

On each of the second and fourth pixel regions PR2 and PR4 that are adjacent to each other in the second direction D2, the first and second photoelectric conversion regions 110a and 110b may be located spaced apart from each other in the second direction D2.

On each of the first and third pixel regions PR1 and PR3, the second and fourth active portions ACT2 and ACT4 may each have a major axis in the second direction D2. On each of the second and fourth pixel regions PR2 and PR4, the second and fourth active portions ACT2 and ACT4 may each have a major axis in the second direction D2.

On each of the first and third pixel regions PR1 and PR3, the first and second pixel gate electrodes PG1 and PG2 may extend in the first direction D1 and cross the second and fourth active portions ACT2 and ACT4, respectively. On each of the second and fourth pixel regions PR2 and PR4, the first and second pixel gate electrodes PG1 and PG2 may extend in the first direction D1 and cross the second and fourth active portions ACT2 and ACT4, respectively.

Figure 25:
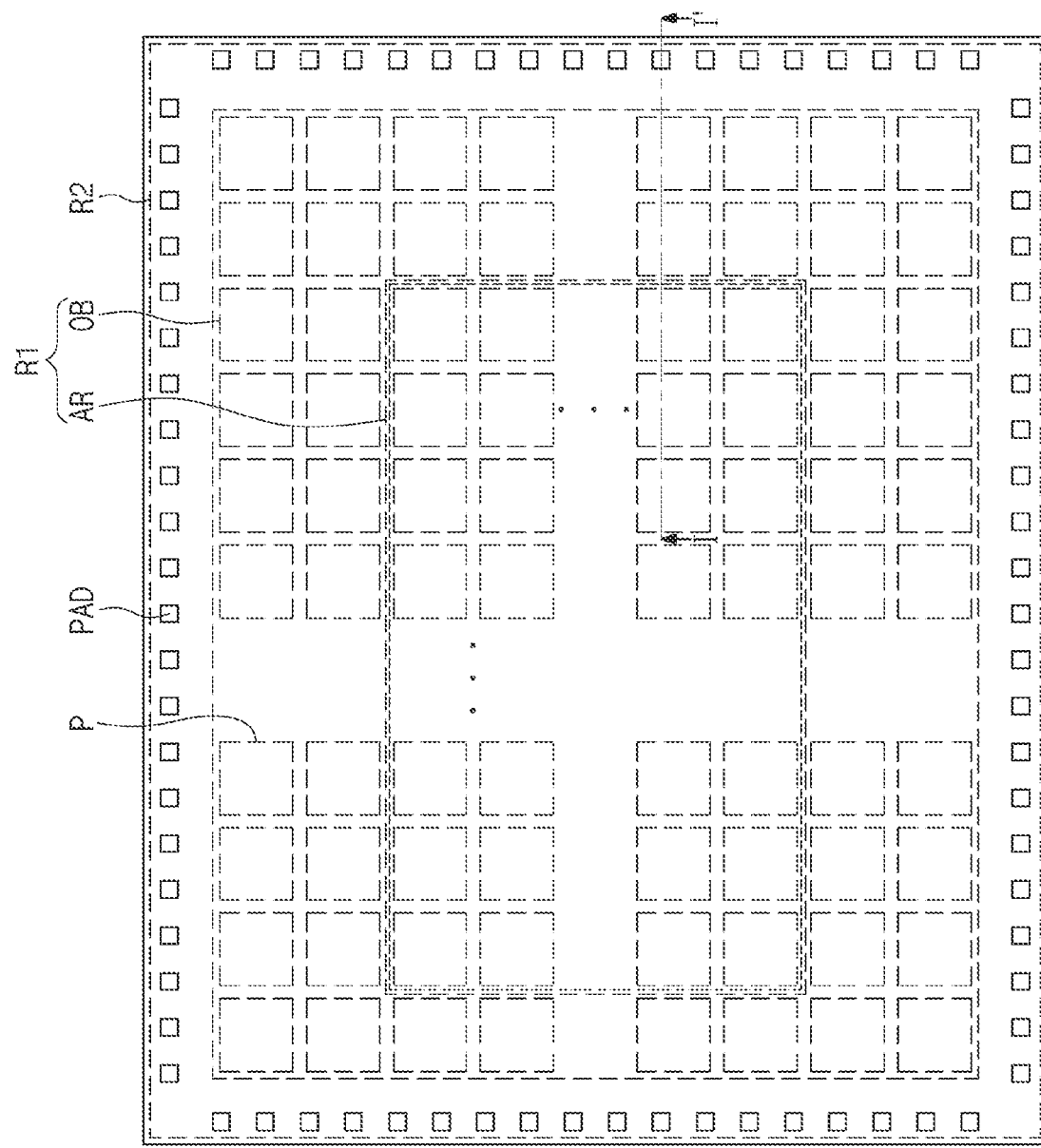
FIG. 25 illustrates a simplified plan view showing an image sensor according to an embodiment of the present inventive concept.
Figure 26:
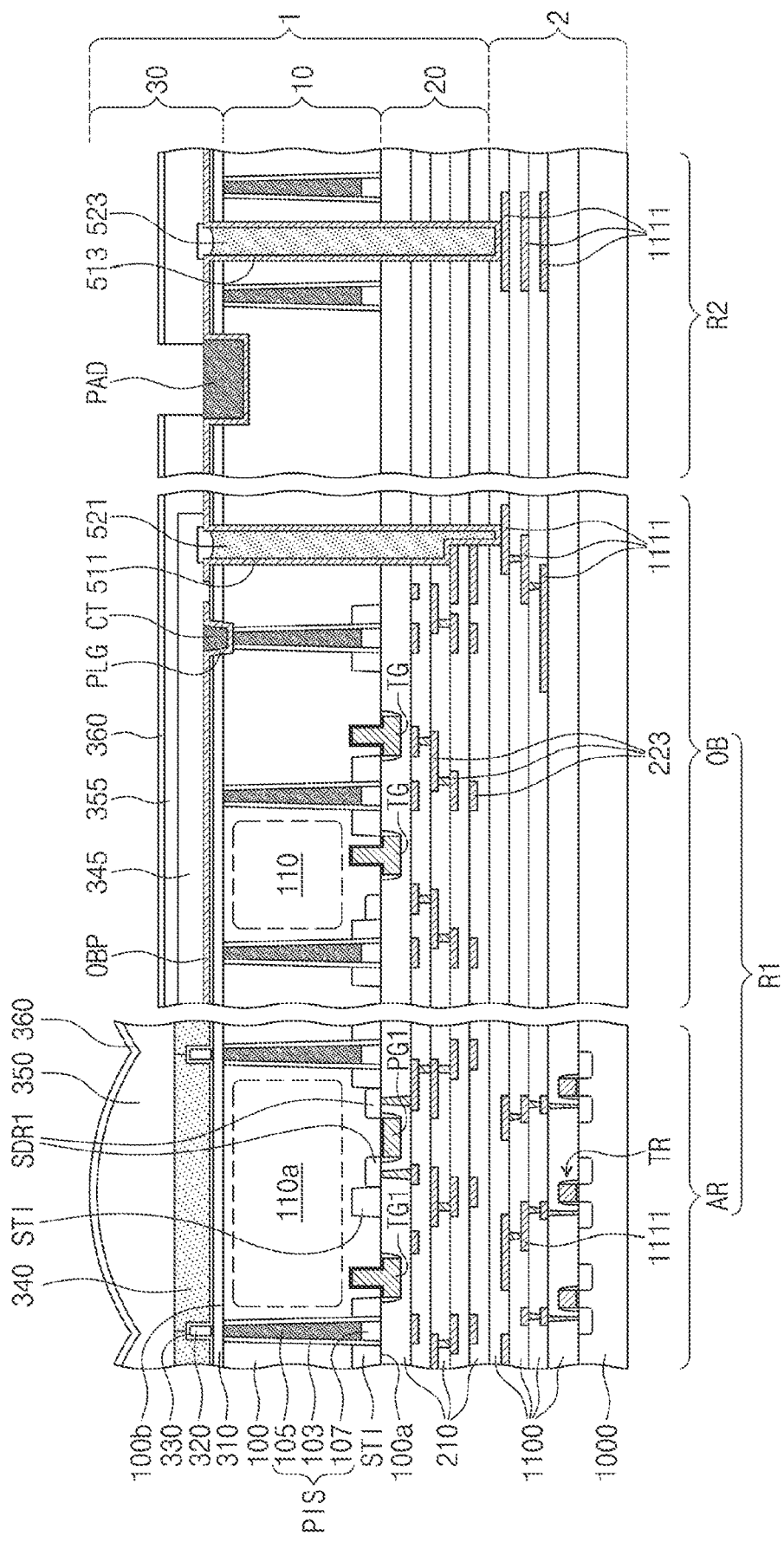
FIGS. 26 and 27 illustrate cross-sectional views taken along line I-I' of FIG. 25, showing an image sensor according to some embodiments of the present inventive concepts.
Figure 27:
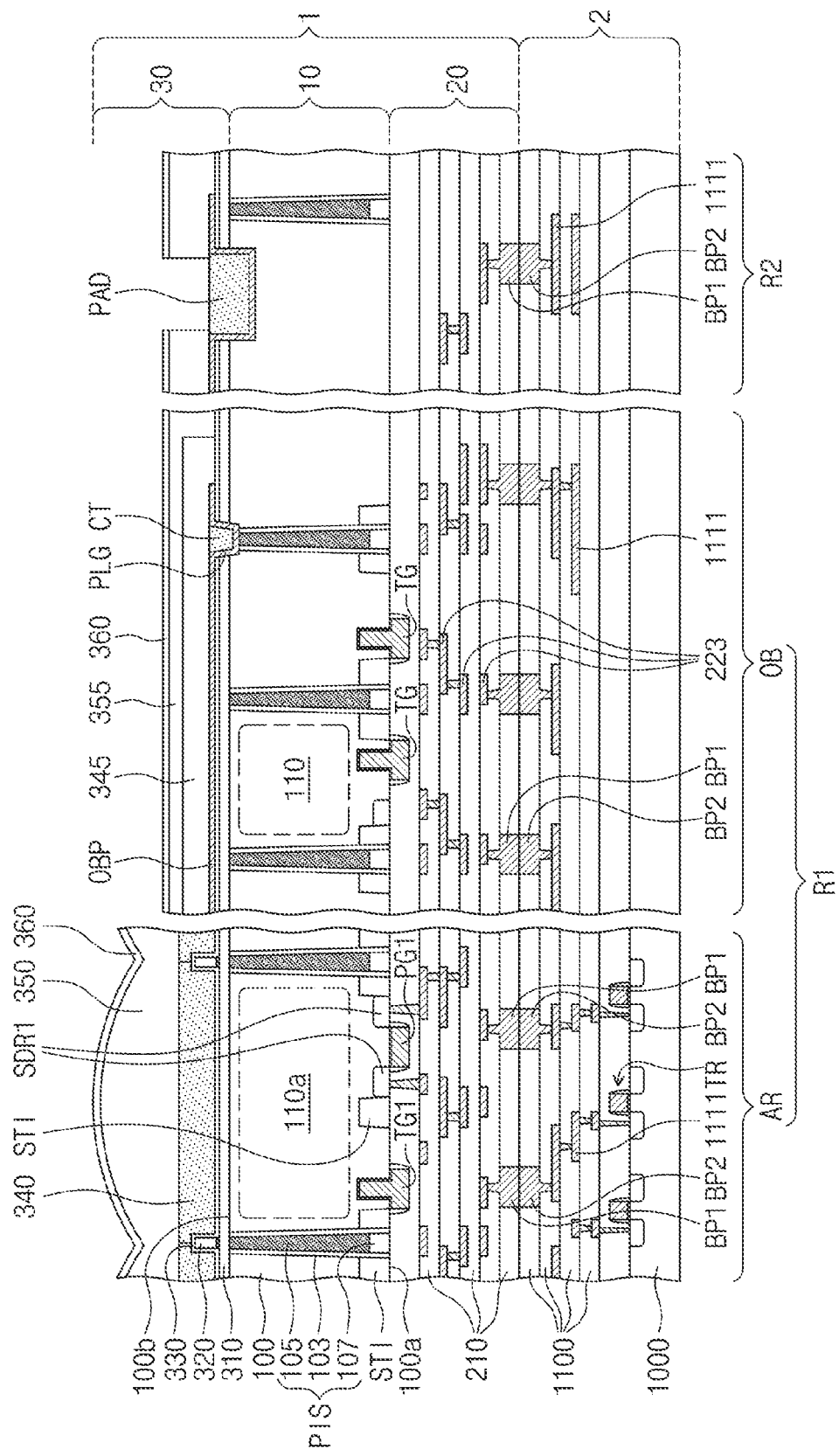

FIG. 25 illustrates a simplified plan view showing an image sensor according to an embodiment of the present inventive concept. FIGS. 26 and 27 illustrate cross-sectional views taken along line I-I' of FIG. 25, showing an image sensor according to an embodiment of the present inventive concept.

Referring to FIGS. 25 and 26, an image sensor may include a sensor chip 1 and a logic chip 2. The sensor chip 1 may include a pixel array region R1 and a pad region R2.

The pixel array region R1 may include a plurality of unit pixels P that are two-dimensionally arranged along a first direction D1 and a second direction D2. Each of the unit pixels P may include a photoelectric conversion element and readout elements. Each unit pixel P of the pixel array region R1 may output electrical signals converted from incident light.

The pixel array region R1 may include a light-receiving area AR and a light-shielding area OB. When viewed in a plan view, the light-shielding area OB may surround the light-receiving area AR. For example, when viewed in a plan view, the light-shielding area OB may be disposed on upside, downside, left-side, and right-side of the light-receiving area AR. The light-shielding area OB may include reference pixels on which little or no light is incident, and an amount of charges sensed in the unit pixels P of the light-receiving area AR may be compared with a reference amount of charges occurring at reference pixels, which may result in obtaining magnitudes of electrical signals sensed in the unit pixels P.

The pad region R2 may include a plurality of conductive pads PAD used for input and output of control signals and photoelectric conversion signals. For easy connection with external devices, when viewed in a plan view, the pad region R2 may surround the pixel array region R1. The conductive pads PAD may allow an external device to receive electrical signals generated from the unit pixels P.

When viewed in a vertical direction, as discussed above, the sensor chip 1 may include a photoelectric conversion layer 10 between a readout circuit layer 20 and an optical transmission layer 30.

As mentioned above, the photoelectric conversion layer 10 of the sensor chip 1 may include a semiconductor substrate 100, a pixel separation structure PIS that defines pixel regions PR, and photoelectric conversion regions 110 provided in the pixel regions PR.

On the light-receiving area AR, the sensor chip 1 may have technical characteristics the same as those of the image sensor discussed above.

The pixel separation structure PIS may be located in the semiconductor substrate 100 on the light-shielding area OB. A portion of the pixel separation structure PIS may be electrically connected to a contact plug PLG on the light-shielding area OB.

A planarized dielectric layer 310 may extend from the light-receiving area AR toward the light-shielding area OB and the pad region R2.

On the light-shielding area OB, a light-shielding pattern OBP may be located on the planarized dielectric layer 310. The light-shielding pattern OBP may block incidence of light onto the photoelectric conversion regions 110 provided on the light-shielding area OB. On reference pixel regions PR of the light-shielding area OB, the photoelectric conversion regions 110 may output noise signals without outputting photoelectrical signals. The noise signal may be generated from electrons produced by heat or dark current. The light-shielding pattern OBP may include metal, such as tungsten, copper, aluminum, or any alloy thereof.

A filtering layer 345 may be provided on the light-shielding pattern OBP. The filtering layer 345 may block light whose wavelength is different from that of light produced from the color filters 340. For example, the filtering layer 345 may block an infrared ray. The filtering layer 345 may include a blue color filter, but the present inventive concepts are not limited thereto.

On the light-shielding area OB, a first through conductive pattern 511 may penetrate the semiconductor substrate 100 and may have electrical connection with a metal line 223 of the readout circuit layer 20 and with a wiring structure 1111 of the logic chip 2. The first through conductive pattern 511 may have a first bottom surface and a second bottom surface that are positioned at different levels. A first filling pattern 521 may be provided in the first through conductive pattern 511. The first filling pattern 521 may include a material whose refractive index is low and may have dielectric characteristics.

On the pad region R2, the conductive pads PAD may be provided on a second surface 100b of the semiconductor substrate 100. The conductive pads PAD may be buried in the second surface 100b of the semiconductor substrate 100. For example, on the pad region R2, the conductive pads PAD may be provided in trenches formed on the second surface 100b of the semiconductor substrate 100. The conductive pads PAD may include metal, such as aluminum, copper, tungsten, titanium, tantalum, or any alloy thereof. In a mounting process of an image sensor, bonding wires may be bonded to the conductive pads PAD. The conductive pads PAD may be electrically connected through the bonding wires to an external device.

On the pad region R2, a second through conductive pattern 513 may penetrate the semiconductor substrate 100 and may have electrical connection with the wiring structure 1111 of the logic chip 2. The second through conductive pattern 513 may extend onto the second surface 100b of the semiconductor substrate 100 and may have electrical connection with the conductive pads PAD. A portion of the second through conductive pattern 513 may cover a bottom surface and a sidewall of the conductive pad PAD. A second filling pattern 523 may be provided in the second through conductive pattern 513. In an embodiment, the second filling pattern 523 includes a material whose refractive index is low and may have dielectric characteristics. On the pad region R2, a pixel separation structure PIS may be provided around the second through conductive pattern 513.

The logic chip 2 may include a logic semiconductor substrate 1000, logic circuits TR, wiring structures 1111 connected to the logic circuits TR, and logic interlayer dielectric layers 1100. An uppermost one of the logic interlayer dielectric layers 1100 may be coupled to the readout circuit layer 20 of the sensor chip 1. The logic chip 2 may be electrically connected to the sensor chip 1 through the first through conductive pattern 511 and the second through conductive pattern 513.

In some embodiments, it is explained that the sensor chip 1 and the logic chip 2 are electrically connected to each other through the first and second through conductive patterns 511 and 513, but the present inventive concepts are not limited thereto.

According to the embodiment shown in FIG. 27, the first through conductive pattern 511 and the second through conductive pattern 513 shown in FIG. 26 may be omitted, and the sensor chip 1 and the logic chip 2 may be electrically connected to each other through direct contact between bonding pads BP1 and BP2 that are provided at uppermost metal layers of the sensor chip 1 and the logic chip 2.

For example, an image sensor may be configured such that the sensor chip 1 may include first bonding pads BP1 provided at an uppermost metal layer of the readout circuit layer 20, and that the logic chip 2 may include second bonding pads BP2 provided at an uppermost metal layer of the wiring structure 1111. The first and second bonding pads BP1 and BP2 may include, for example, at least one selected from tungsten (W), aluminum (Al), copper (Cu), tungsten nitride (WN), tantalum nitride (TaN), and titanium nitride (TiN).

A hybrid bonding technique may be employed to directly and electrically connect the first bonding pads BP1 of the sensor chip 1 to the second bonding pads BP2 of the logic chip 2. In this description, the term "hybrid bonding" may denote a bonding method in which two components of the same kind are merged at an interface therebetween. For example, when the first and second bonding pads BP1 and BP2 are formed of copper, a copper-to-copper bonding may be employed to physically and electrically connect the first and second bonding pads BP1 and BP2 to each other. In addition, a dielectric-to-dielectric bonding may be adopted to couple a surface of a dielectric layer included in the sensor chip 1 to a surface of a dielectric layer included in the logic chip 2.

According to some embodiments of the present inventive concept, pixel transistors provided on each pixel region may be disposed to overlap a photoelectric conversion region, and thus an image sensor may have increased integration.

Moreover, even though unit pixels have reduced sizes, effective channel lengths of the pixel transistors may be securely obtained to optimize characteristics of the pixel transistors. Accordingly, an image sensor may have increased electrical characteristics.

Although the present inventive concept has been described in connection with some embodiments illustrated in the accompanying drawings, it will be understood to those skilled in the art that various changes and modifications may be made without departing from the technical spirit and feature of the present inventive concept. It will be apparent to those skilled in the art that various substitution, modifications, and changes may be thereto without departing from the scope and spirit of the present inventive concepts.

What is claimed is:

1. An image sensor, comprising:
   a semiconductor substrate including a first surface and a second surface disposed opposite to the first surface;
   a pixel separation structure disposed in the semiconductor substrate and defining a pixel region, the pixel separation structure surrounding the pixel region in a plan view;
   first and second photoelectric conversion regions disposed in the semiconductor substrate on the pixel region;
   a first transfer gate electrode disposed on the first surface of the semiconductor substrate and between the first photoelectric conversion region and a first floating diffusion region;
   a second transfer gate electrode disposed on the first surface of the semiconductor substrate and between the second photoelectric conversion region and a second floating diffusion region;
   a pixel gate electrode disposed on the first surface of the semiconductor substrate and overlapping one of the first and second photoelectric conversion regions;
   impurity regions disposed on opposite sides of the pixel gate electrode; and
   a microlens disposed on the second surface of the semiconductor substrate and the pixel region,
   wherein the microlens vertically overlaps the first and second photoelectric conversion regions,
   wherein the first and second photoelectric conversion regions are spaced apart from each other in a first direction,
   wherein the first transfer gate electrode is spaced apart from the pixel gate electrode in a second direction that intersects the first direction, and
   wherein the first and second directions are parallel to the first surface of the semiconductor substrate.

2. The image sensor of claim 1, wherein the impurity regions are spaced apart from each other in the second direction.

3. The image sensor of claim 1, wherein the pixel gate electrode has a bottom surface at a level lower than a level of the first surface of the semiconductor substrate.

4. The image sensor of claim 1, further comprising a fin active pattern disposed on the first surface of the semiconductor substrate, wherein the pixel gate electrode surrounds opposite sidewalls and a top surface of the fin active pattern.

5. The image sensor of claim 1, wherein the pixel separation structure comprises:
   a plurality of first portions extending in the first direction and spaced apart from each other;
   a plurality of second portions crossing the first portions and extending in the second direction, the second portions spaced apart from each other; and
   a plurality of third portions each protruded from the first portions in the second direction, the third portions opposite to each other.

6. The image sensor of claim 5, wherein the third portions are disposed between the first and second photoelectric conversion regions in a plan view.

7. The image sensor of claim 1, wherein each of the first and second photoelectric conversion regions has a first width in the first direction and a first length in the second direction, wherein the first length is greater than the first width.

8. An image sensor, comprising:
   a semiconductor substrate having a first surface and a second surface opposite to the first surface;
   a pixel separation structure disposed in the semiconductor substrate and defining a pixel region, the pixel separation structure surrounding the pixel region in a plan view;
   first and second photoelectric conversion regions disposed in the semiconductor substrate on the pixel region and spaced apart from each other in a first direction;
   a device isolation layer disposed in the first surface of the semiconductor substrate, the device isolation layer defining first and second active portions that overlap the first photoelectric conversion region and third and fourth active portions that overlap the second photoelectric conversion region, when viewed in a plan view;
   first and second transfer gate electrodes disposed on the first and third active portions, respectively; and
   first and second pixel gate electrodes extending in the first direction and crossing the second and fourth active portions, respectively,
   wherein each of the second and fourth active portions has a lengthwise axis that extends in a second direction that intersects the first direction, wherein the first transfer gate electrode is spaced apart from the first pixel gate electrode in the second direction, wherein the second transfer gate electrode is spaced apart from the second pixel gate electrode in the second direction, and wherein the first and second directions are parallel to the first surface of the semiconductor substrate.

9. The image sensor of claim 8, further comprising:

first impurity regions disposed in the second active portion on opposite sides of the first pixel gate electrode, the first impurity regions being spaced apart from each other in the second direction, the second direction intersecting the first direction; and second impurity regions disposed in the fourth active portion on opposite sides of the second pixel gate electrode, the second impurity regions spaced apart from each other in the second direction.

10. The image sensor of claim 8, wherein the pixel separation structure comprises:

a plurality of first portions extending in a first direction and spaced apart from each other;

a plurality of second portions crossing the first portions and extending in the second direction, the second portions spaced apart from each other; and a plurality of third portions each protruded from the first portions in the second direction, the third portions opposite to each other, wherein the third portions are disposed between the first and second photoelectric conversion regions.

11. The image sensor of claim 8, wherein each of the first and second photoelectric conversion regions has a first width in the first direction and a first length in the second direction, the first length being greater than the first width, the second direction intersecting the first direction, and each of the second and fourth active portions has a second width in the first direction and a second length in the second direction, the second width being less than the first width, and the second length being greater than the second width and less than the first length.

12. The image sensor of claim 8, wherein each of the first and second pixel gate electrodes has a bottom surface at a level lower than a level of the first surface of the semiconductor substrate.

13. The image sensor of claim 12, wherein each of the first and second transfer gate electrodes has a bottom surface at a level lower than the level of the first surface of the semiconductor substrate, wherein the levels of the bottom surfaces of the first and second transfer gate electrodes are substantially the same as the levels of bottom surfaces of the first and second pixel gate electrodes.

14. The image sensor of claim 8, further comprising:

a first fin active pattern disposed on the second active portion; and a second fin active pattern disposed on the fourth active portion, wherein the first pixel gate electrode surrounds opposite sidewalls and a top surface of the first fin active pattern, and wherein the second pixel gate electrode surrounds opposite sidewalls and a top surface of the second fin active pattern.

* * * * *